(12) United States Patent
Miller et al.

(10) Patent No.: US 6,539,531 B2
(45) Date of Patent: Mar. 25, 2003

(54) METHOD OF DESIGNING, FABRICATING, TESTING AND INTERCONNECTING AN IC TO EXTERNAL CIRCUIT NODES

(75) Inventors: Charles A. Miller, Fremont, CA (US); John M. Long, Milpitas, CA (US)

(73) Assignee: FormFactor, Inc., Livermore, CA (US)

( * ) Notice: Subject to any disclaimer, the term of this patent is extended or adjusted under 35 U.S.C. 154(b) by 97 days.

(21) Appl. No.: 09/728,050

(22) Filed: Dec. 1, 2000

(65) Prior Publication Data

US 2001/0000427 A1 Apr. 26, 2001

Related U.S. Application Data

(63) Continuation-in-part of application No. 09/258,185, filed on Feb. 25, 1999, now Pat. No. 6,448,865.

(51) Int. Cl.[7] .............................................. G06F 17/50
(52) U.S. Cl. ....................................................... 716/15
(58) Field of Search ............................... 216/14; 716/8, 716/11–16, 6

(56) References Cited

U.S. PATENT DOCUMENTS

| | | | | |
|---|---|---|---|---|
| 5,459,673 A | * | 10/1995 | Carmean et al. | 716/6 |
| 5,812,414 A | * | 9/1998 | Butts et al. | 716/16 |
| 6,029,344 A | * | 2/2000 | Khandros et al. | 216/14 |
| 6,324,678 B1 | * | 11/2001 | Dangelo et al. | 716/11 |

* cited by examiner

Primary Examiner—Matthew Smith
Assistant Examiner—Thuan Do
(74) Attorney, Agent, or Firm—Daniel J. Bedell; Smith-Hill & Bedell

(57) ABSTRACT

A method for designing integrated circuits (ICs) and their interconnect systems includes IC component cells and interconnect component cells in a cell library. Each IC component cell provides both a physical and behavioral model of a component that may be incorporated into the IC while each interconnect component cell includes both a physical and behavioral model of a separate internal or external component of an interconnect system that may link the IC to external nodes. Both the IC and its interconnect systems are designed by selecting and specifying interconnections between component cells included in the cell library. Interconnect systems are flexibly designed to act like filters tuned to optimize desired frequency response characteristics. Behavior models of the IC and its interconnect systems, based on the behavior models of their selected component, are subjected to simulation and verification tools to determine whether the IC and its interconnect systems meet various performance criteria and constraints. The structural models of the interconnect systems developed during the design process guide subsequent fabrication of interconnect systems for both the IC's intended testing and operating environments.

29 Claims, 9 Drawing Sheets

METHOD OF DESIGNING, FABRICATING, TESTING AND INTERCONNECTING AN IC TO EXTERNAL CIRCUIT NODES

CROSS-REFERENCE TO RELATED APPLICATIONS

The present application is a continuation-in-part of application Ser. No. 09/258,185, filed Feb. 25, 1999 now U.S. Pat. No. 6,448,865.

BACKGROUND OF THE INVENTION

1. Field of the Invention

The present invention relates in general to a process of designing, simulating, fabricating, testing and interconnecting integrated circuits (ICs), and in particular to a method for fully integrating the interconnect systems that are to connect ICs to external circuits into all stages of that process.

2. Description of Related Art

Integrated Circuit Process Flow

Figure 1:
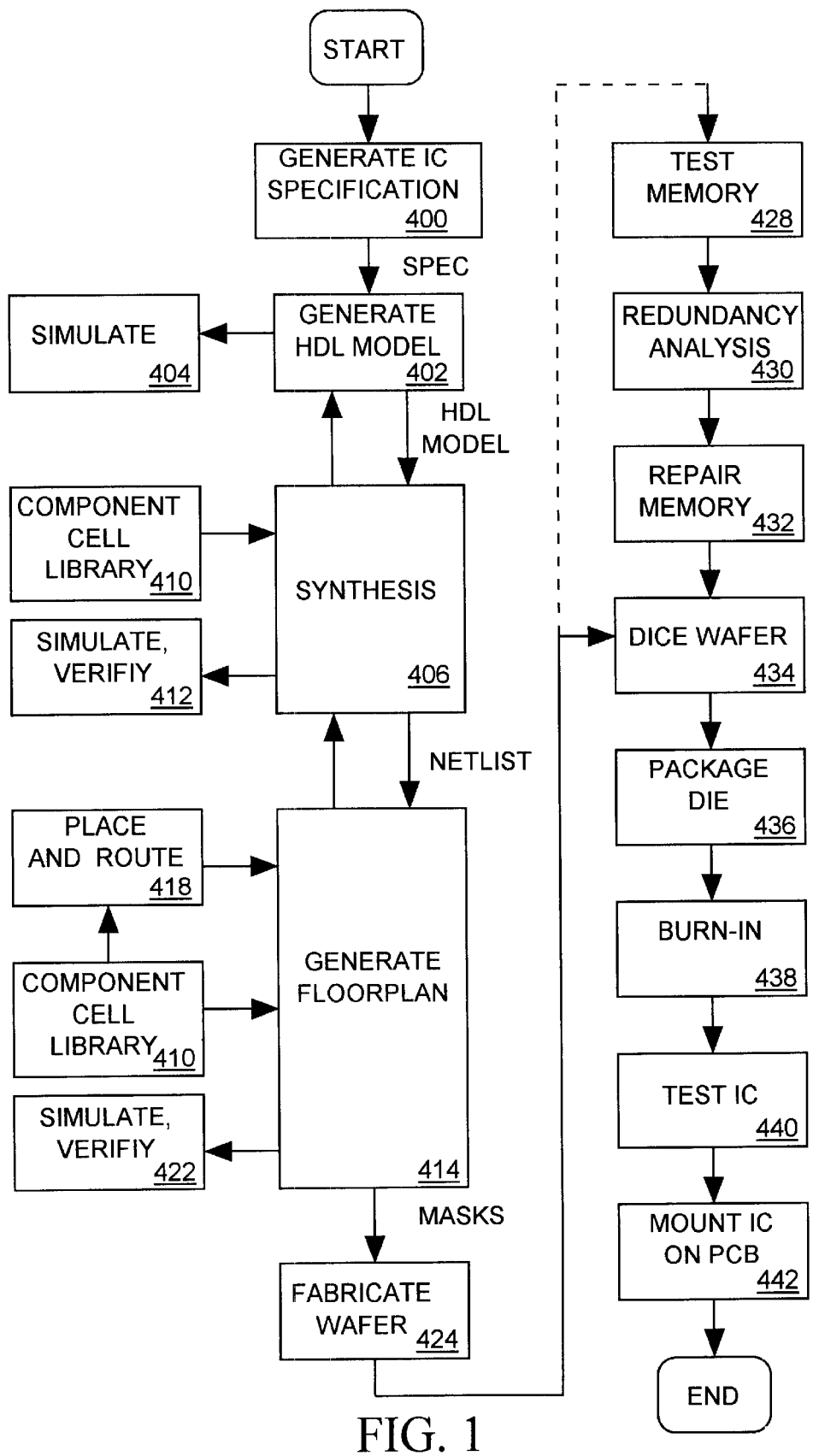

FIG. 1 illustrates a typical prior art process of designing, fabricating, testing, and connecting an integrated circuit (IC). A design engineer initially develops a design specification (step 400) abstractly describing the functionality and overall architecture of the IC and then develops a high-level hardware description language (HDL) model of the IC describing how data flows between clocked registers and how the design processes that data (step 402). The design engineer also programs a circuit simulator (step 404) to simulate circuit behavior based on the HDL circuit model and may iteratively adjust and simulate the HDL model until verifying that the circuit logic is correct. Since the HDL model is a relatively high level behavioral model of the circuit, simulation can verify circuit logic at step 404 but cannot verify circuit timing because it does not take into account various constraints of the particular semiconductor technology that will implement the IC.

Thereafter, the design engineer usually employs computer-aided logic synthesis tools (step 406) to convert the high-level HDL circuit model into a lower-level, technology-specific, behavioral model of the circuit such as a netlist. A netlist model typically describes the behavior of circuit components based on models provided by a cell library 410. Each cell of cell library 410 includes both netlist-level behavioral models and structural models (mask layouts) for each circuit component that may be incorporated into an IC. Cell library 410 may include cells describing low level circuit components such as individual resistors and transistors as well as higher level standard circuit components such as logic gates, memories and central processing units.

During the iterative, synthesis process the design engineer uses a simulator and other tools to verify circuit operation based on the netlist model (step 412) and may iteratively adjust the HDL model to produce a netlist model that satisfies various constraints on circuit operation defined in the specification and incorporated into the HDL model. Since the netlist model is more closely related to the eventual physical realization of the IC than the HDL model, simulation and special timing verification tools can verify both circuit logic and timing constraints. However, timing constraints verification at this stage of the design may not be entirely accurate since the netlist model does not specify the actual physical positions on an IC chip of the cells that will form the circuit or the actual lengths and impedance characteristics of signal paths between those cells.

Having verified the logic and timing of the netlist circuit model, the design engineer employs additional computer-aided design tools to establish a floorplan (step 414) fixing locations of the IC's input/output (I/O) terminals and fixing the positions of various large, high level circuit modules included in cell library 410 that are to be placed in particular areas of the IC substrate. Placement and routing tools establish the detailed layout of the various layers of IC, determining where each cell of the IC is to be placed and how the conductors interconnecting those cells are to be routed (step 418). In addition to a behavioral model of a circuit component, each component cell of cell library 410 also includes a structural model (mask layout) of the circuit component that can be incorporated into the IC layout. The CAD tools performing the floorplanning, placement and routing functions iteratively vary the IC design, subjecting each variation to simulation and verification (step 422) to determine how well it satisfies the various timing and logic constraints imposed by the specification. Timing verification at this point is more accurate than the timing verification carried out on netlist at step 412 because it takes into account the actual physical layout of the cells and their interconnections.

The output of the placement and placement and routing process 418 is a structural model of the IC in the form of a set of masks telling an IC manufacturer how to fabricate the various layers of the IC. When an IC fabricated on a semiconductor wafer includes a "repairable" embedded memory, a memory test is usually performed (step 428) while the IC is still in the form of a die on the wafer. "Repairable" memories typically have one or more "spare" rows or columns of memory cells that can replace a row or column containing one or more defective cells. The results of the memory test are subjected to "redundancy analysis" (step 430) to determine how to best allocate spare rows and/or columns to replace the rows and/or columns containing defective cells. The memory is then repaired (step 432) using lasers or other means to appropriately alter signal path routing within the IC so that spare rows and/or columns of cells are substituted for rows and columns having defective cells.

After repairing the memory (step 432), or immediately after fabrication (step 424) when the IC has no repairable memory, the wafer is "diced" to separate the individual die (step 434) and packaged (step 436). The packaged IC may the be subjected to a "burn-in" process (step 438) wherein it is heated in an oven to place it under the kind of heat stress they it may encounter in its working environment. Thereafter the packaged IC is subjected to logic and parametric testing (step 440). The packaged IC is later mounted on a circuit board in its intended operating environment (step 442). The IC testing step 440 can be carried out before the dicing step 434 while the IC is still in the form of a die on the wafer.

Interconnect Systems

As a part of the IC design process, IC designers must concern themselves with the structures that connect nodes of an IC to external circuits. In a typical packaged IC, each circuit node that is to communicate with external circuits is linked to a bond pad on the surface of the IC chip. A bond wire connects the bond pad to a conductive leg extending from the package surrounding the IC chip. When the IC is mounted on a printed circuit board (PCB) the package leg is usually soldered to a PCB trace on the surface of the PCB. When bond pads of one or more other ICs mounted on the PCB are linked to the PCB trace, the bond pads, bond wires, package legs, and the PCB trace form an interconnect system for conveying signals between nodes of two or more ICs. Other interconnect systems are also used. For example, in "solder ball" IC packages the bond wires link the IC pads to balls of solder on the underside of the package that bond to PCB traces when the IC is installed on a PCB.

Figure 2:
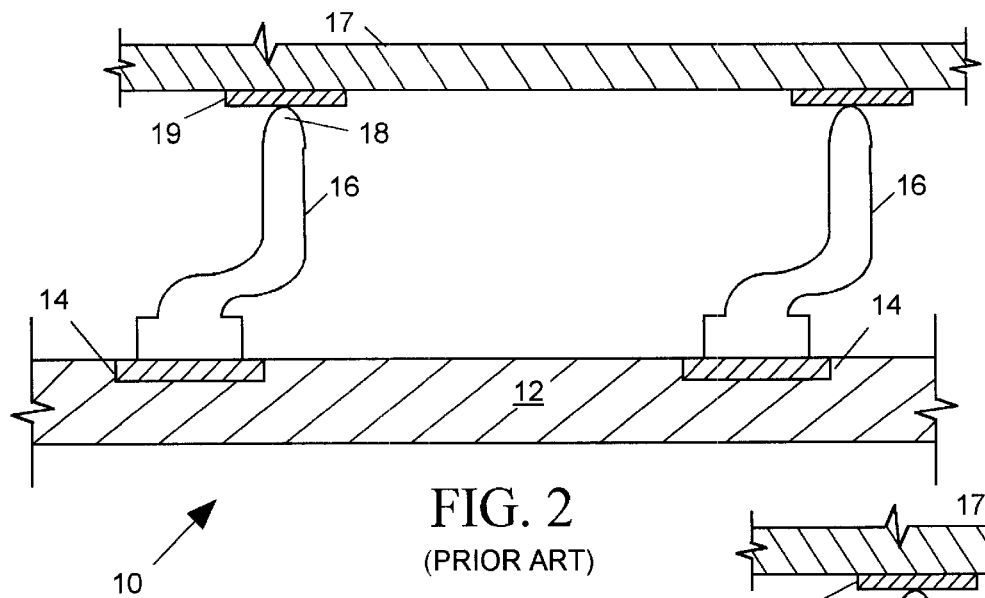
Figure 3:
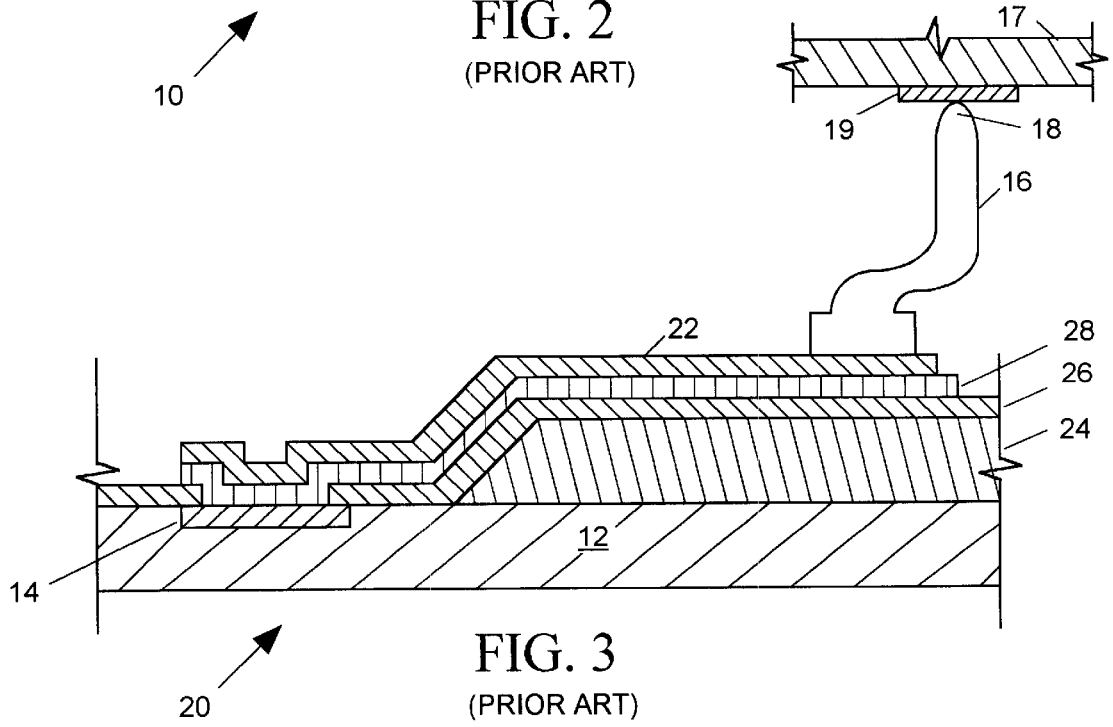

Spring contact interconnects are becoming popular replacements for bond wire and solder ball interconnect technologies in many applications because they eliminate the need for IC packaging and because they provide a number of other advantages. FIGS. 2 and 3 are partial sectional elevation views of an IC 10 and an IC 20 employing small wire-spring contacts 16. The circuits implemented by IC 10 are implemented on a silicon wafer substrate 12. A separate bond pad 14 is formed at the surface of substrate 12 for each of the IC's I/O signals. In the IC 10 of FIG. 2, a conductive wire-spring contact 16 is attached to each bond pad 14. Each wire-spring contact 16 is suitably formed, for example, by a gold wire welded to the bond pad 14 and coated with a resilient alloy. The unpackaged IC 10 can be installed directly on a printed circuit board (PCB) 17 with the tip 18 of each wire-spring contact 16 contacting a trace 19 on the surface of PCB 17.

In IC 20, as illustrated in FIG. 3, the wire-spring contact 16 can be mounted remote from a bond pad 14 on substrate 12 when linked to the bond pad 14 via a conductive trace 22 formed on a "redistribution layer" on the surface of an IC 20. Trace 22 is attached to bond pad 14 through a conductive adhesion layer 28 and isolated from portions of IC 12 other than bond pad 14 by insulating polyimide layers 24 and 26.

Figure 4:
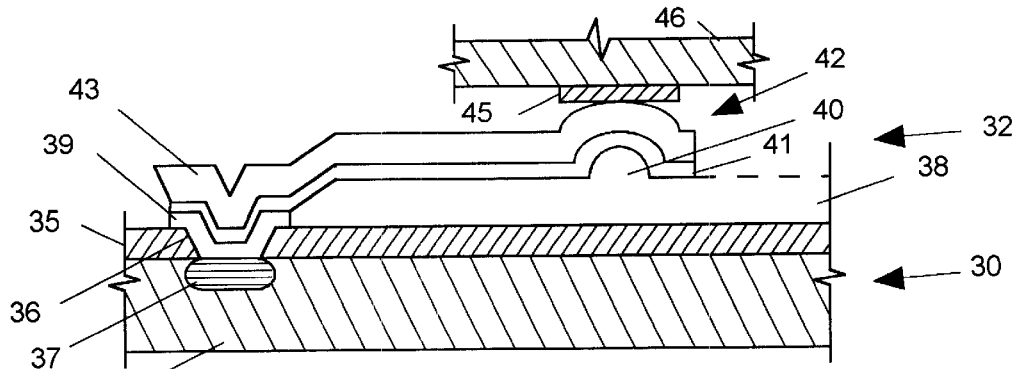

FIG. 4 is a simplified, partial sectional elevation view of an IC 30 employing another kind of spring contact, a "litho-spring" contact 32. An insulating passivation layer (e.g., polyimide) 35 disposed on the surface of substrate 34 includes an opening 36 immediately above a contact pad 37. A conductive layer 39 (e.g., titanium-tungsten) is deposited on the surface of passivation layer 35 with the sidewalls of opening above contact pad 37 making electrical contact with contact pad 37. A layer 38 of masking material (e.g., photoresist) is then deposited onto layer 35 and patterned by photolithographic techniques to include an opening above contact pad 37 extending through masking layer 38 to conductive layer 39. Layer 38 also includes a bump 40 forming a base for the wire-spring contact's tip 42. A conductive seed layer 41 (e.g., gold) is then deposited over masking layer 38 and lithographically etched to form the basic shape of contact 32. A resilient, conductive contact layer 43 (e.g., nickel) is then plated onto seed layer 41. The photoresist masking layer 38 is then removed with a solvent (e.g., acetone), and other remaining layers (e.g. part of layer 39) are removed using suitable techniques. In the completed wire-spring contact 32, tip 42 has freedom to flex vertically when pressed against a trace 45 on a circuit board 46.

Attenuation and Distortion in Interconnect Systems

In high frequency applications an interconnect system can severely attenuate and distort signals passing between the IC and external circuits. The conventional approach to reducing the amount of signal distortion and attenuation caused by the interconnect system has been to minimize the series inductance and shunt capacitance of the interconnect system. Much of the inductance in packaged IC interconnect system comes from bond wires and package legs or spring contacts. Designers try to minimize that inductance by keeping the bond wires and package legs or spring contacts as short as possible. Interconnect system capacitance arises mainly from the capacitances of bond pads and printed circuit board (PCB) traces, and the capacitances of terminating devices within the IC such as drivers, receivers and electrostatic discharge protection (ESD device) devices. Designers try to minimize the interconnect system capacitance when designing such components. However, while minimizing interconnect system inductance and capacitances can help improve bandwidth, flatten frequency response and reduce signal distortion, it is not possible to completely eliminate interconnect system inductance and capacitance. Thus some level of signal distortion and attenuation in an interconnect system is inevitable, and can become problematic particularly at high signal frequencies.

Interconnect System Design

While IC designers must sometimes be concerned with the frequency response of an entire interconnect system linking a node of an IC to a node of an external circuit, the design tools they work with treat the internal and external components of an interconnect system in a somewhat fragmented manner. Conventional IC cell libraries typically include separate physical and behavioral models of various portions of an IC interconnect system that are internal to the IC such as drivers, receivers, ESD devices, bond pads and the like. However, such cell libraries do not include models of the portions of the interconnect system external to an IC such as bond wires and package legs, litho-spring or wire-spring contacts, microstrip traces, circuit board vias and the like because they are not part of the IC.

However, since the external portions of an interconnect system influence the behavior of an IC at its I/O terminals, a design engineer may provide a behavioral model of the external portions of the interconnect system that can be incorporated into the HDL and netlist circuit models for use by simulation and verification tools. Such models usually depict the external portions of an interconnect system as a transmission line of a standard characteristic impedance (typically 50 Ohms) that is terminated with a specified load. The simulation and verification tools employed at steps 412 and 422 of the IC process flow of FIG. 1 can make reasonably accurate predictions of circuit behavior at the bond pads when designers endeavor to make the external portions of the interconnect systems and external loads conform to the models.

IC designers typically specify uniform interconnect systems for all IC terminals partly because IC manufacturing processes readily lend themselves to interconnect uniformity and partly because it is difficult and time-consuming to custom design an interconnect system for each IC terminal. However, while interconnect systems for all terminals of an IC are usually standardized, the frequency response and current-carrying capability of the standard interconnect system may not be ideally suited for all of the IC's I/O, power or ground signals since not all such signals are similar in nature.

For example, suppose an IC has both low frequency analog I/O signals and high frequency digital I/O signals. While a designer also might want the interconnect system conveying the analog signals to provide very low distortion at low signal frequencies and to block high frequency noise, the designer might want the interconnect systems conveying the high frequency digital output signals to have a high bandwidth. Thus, if we use the same interconnect system for each kind of signal, the interconnect system can be a limiting factor in IC design. For example when a standard interconnect system cannot handle a high frequency digital I/O signal, an IC may be designed to use two or more lower frequency I/O signals in its place. Or when an IC's standard pin size is not sufficient to handle all of the IC's power and ground currents, several pins may be needed to supply power and ground to an IC. When we employ such measures to avoid customizing interconnect systems for individual IC terminals we can increase both the size and cost of an IC.

IC Tester Interconnects

As I/O signal frequencies increase, the design of structures we use to link a wafer-level IC tester to test points on an IC wafer becomes increasingly problematic. When wafer-level IC tester interconnect systems do not have the same frequency response characteristics as interconnect systems employed in an IC's intended operating environment, then many ICs that would operate properly in their intended operating environment can fail tests and be rejected or de-rated.

Figure 5:
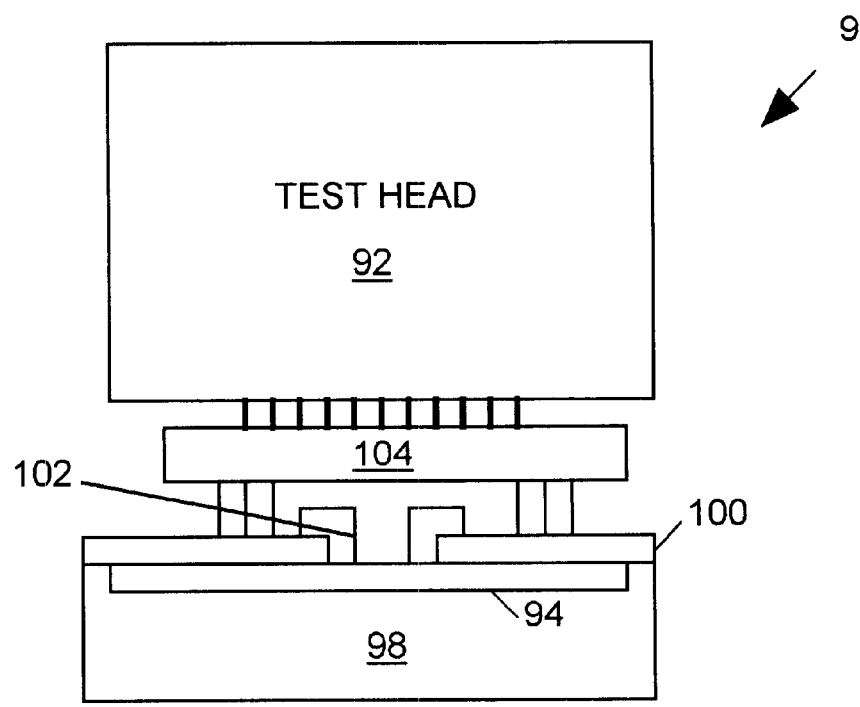

One difficulty in conforming test and operating environment interconnects arises because IC I/O signals typically must travel longer distances in a test environment than in its intended operating environment. FIG. 5 is a simplified side elevation view of a typical wafer-level IC tester 90 that can carry out a memory test at step 428 of FIG. 1 or a logic or parametric test on an IC while still in wafer from. Tester 90 includes a test head 92 containing printed circuit boards implementing the circuits that test a wafer 94. The test circuits are usually organized into a set of similar "channels", with each channel including all the circuitry needed to generate a test signal input to one test point on the wafer and to monitor any wafer output signal produced at that test point. Each channel usually has a single bi-directional input/output (I/O) port through which it communicates with an IC bond pad on the surface of wafer 94.

A "prober" 98 holding wafer 94 includes a probe card 100 having a set of probes 102 for accessing bond pads on the surface of one or more ICs on wafer 94. An interconnect structure 104 residing between the test head 92 and wafer 98 provides signal paths between the tester's I/O ports and probe card 100. Thus a test signal produced by test head 92 travels to an I/O terminal of wafer 94 through a signal path extending through interconnect structure 104, probe card 100 and probes 102. An IC output signal would travel over a similar path in an opposite direction.

Such a signal path can differ substantially both in length and nature from the signal path (e.g., bond wires, pins and PCB traces) though which that IC I/O terminal will eventually communicate when it is in its intended operating environment. The frequency response characteristics of the test signal path may therefore also differ substantially from the behavioral models the design engineer supplied to simulation and verification tools during the IC design process. Such discrepancies between an interconnect system's behavioral model employed during the IC design phase and its actual test and operating environment implementation can cause ICs that would function properly in their intended operating environments to fail tests and be discarded or de-rated.

IC manufacturers like to test an IC while still in wafer form because it allows them to avoid the cost of packaging defective ICs. However high frequency ICs are often tested after they are packaged (as illustrated in FIG. 1) because the wafer-level test environment fails to account for the influence of the bond wires and package legs on IC performance.

What is needed is a method for designing, simulating, fabricating, testing and interconnecting ICs wherein a designer can easily adapt the interconnect system for each of an IC's terminals to satisfy the requirements of the particular signal it is to convey, and wherein the signal paths in the IC's wafer-level testing environment and in its intended operating environment can substantially match their behavioral models employed during the IC design process.

SUMMARY OF THE INVENTION

In accordance with one aspect of the invention, a cell library for a computer-aided integrated circuit (IC) design system includes "interconnect component cells" describing all of the of IC interconnect systems that can link the IC's power, ground and input/output (I/O) terminals to nodes of external circuits. Each interconnect component cell includes both a physical model and a behavioral model of the component. Such interconnect component cells describe not only internal IC components such as signal drivers and receivers, electrostatic discharge (ESD) protection devices and bond pads, they also describe external interconnect system components such as bond wires, package legs, spring contacts, and printed circuit board (PCB) components.

As in conventional IC design processes, computer-aided design (CAD) tools iteratively design the IC layout as arrangements of conventional IC component cells included in the cell library. The CAD tools simulate and verify each iteration of the IC design to determine how well the design meets IC performance criteria and constraints described in an IC specification provided as input to the CAD tools. However, in accordance with another aspect of the invention, the specification also describes various performance criteria and constraints for each interconnect system that is to link a terminal of the IC to an external circuit. When the CAD tools design the IC as an arrangement of library cells, they also iteratively design a complete interconnect system for each of the IC's terminals as arrangements of the interconnect component cells also included in the cell library, including portions both internal and external to the IC. When they simulate and verify the behavior of the IC design, the CAD tools also simulate and verify the behavior of the interconnect systems to determine how well they meet their performance criteria and constraints.

In accordance with a further aspect of the invention, when the IC is to employ spring contacts, the cell libraries also include interconnect component cells describing a variety of spring contacts that may be employed in the IC. The CAD tools that design the IC and the interconnect systems that will link the IC to external circuits also design the spring contacts.

In accordance with yet another aspect of the invention, the cell libraries include interconnect component cells describing portions of the interconnect system integrated circuit testers use to access the IC during testing. The CAD tools that design, simulate and verify the performance of an IC and the interconnect systems that will link the IC to external circuits in its intended operating environment, concurrently design, simulate and verify the performance of an interconnect system to be employed in the IC's wafer-level or packaged IC testing environment.

It is accordingly an object of the invention to provide a system for designing, simulating, verifying, fabricating and testing an IC that permits a designer to easily optimize the testing and operating environment interconnect system for each IC terminal to suit the characteristics of the particular signal it is to convey.

It is another object of the invention to provide a system for designing, simulating, fabricating, and testing an IC in which interconnect systems employed in an IC's wafer-level testing environment and in its intended operating environment both behave in a manner substantially similar to that assumed by IC simulation and verification tools employed during the IC design process.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 7:
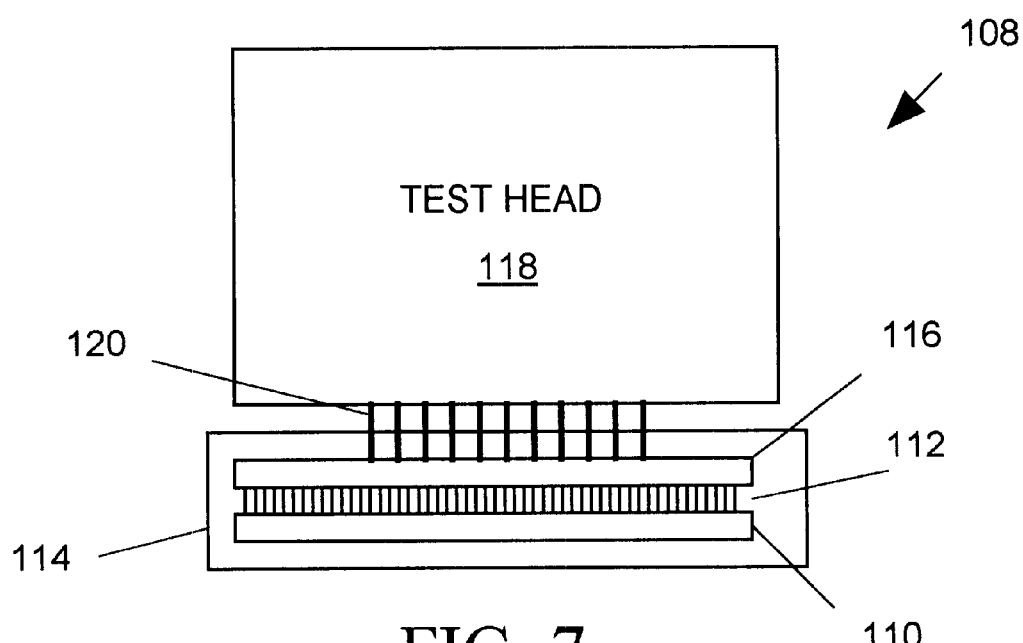
Figure 6:
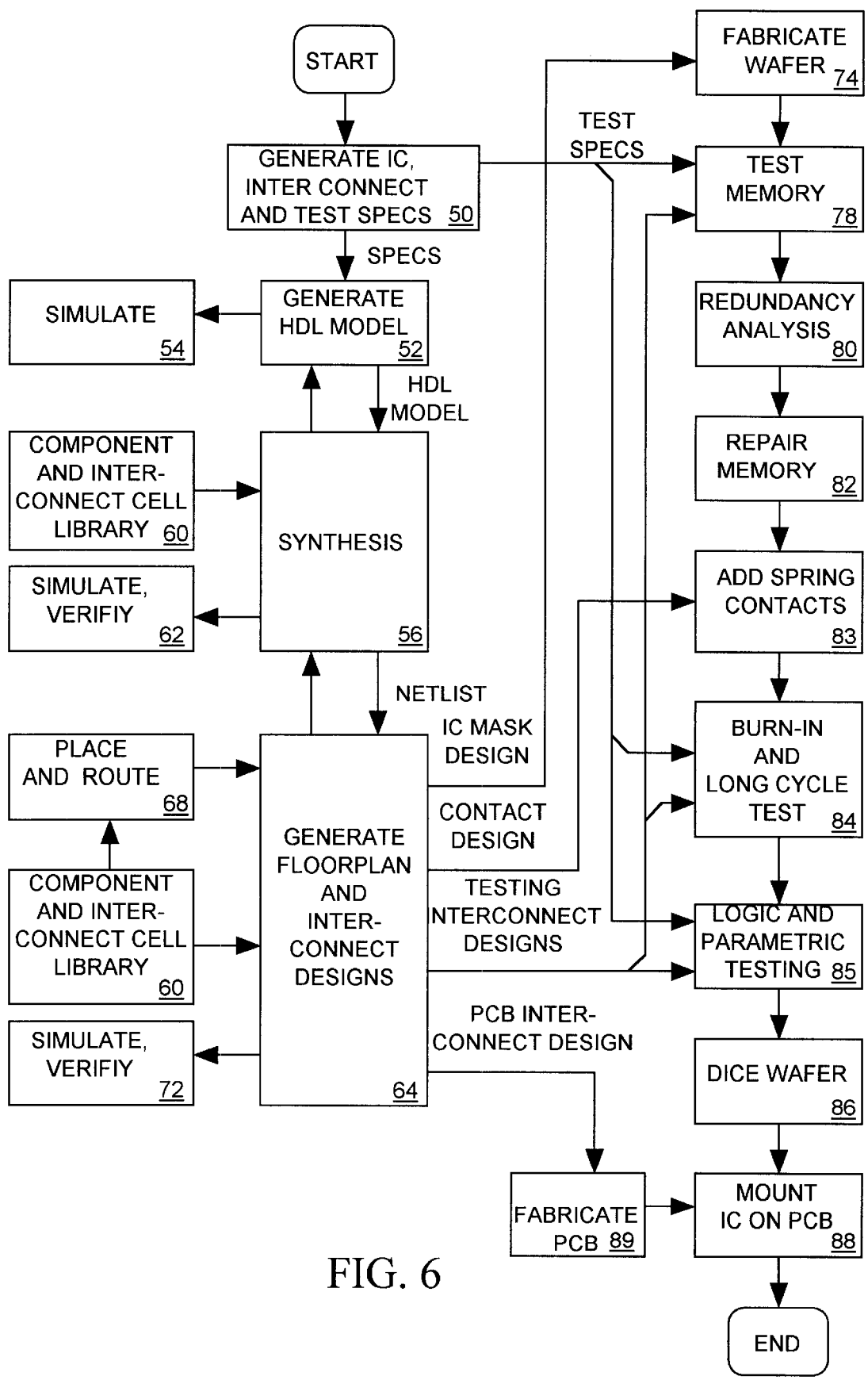
Figure 8:
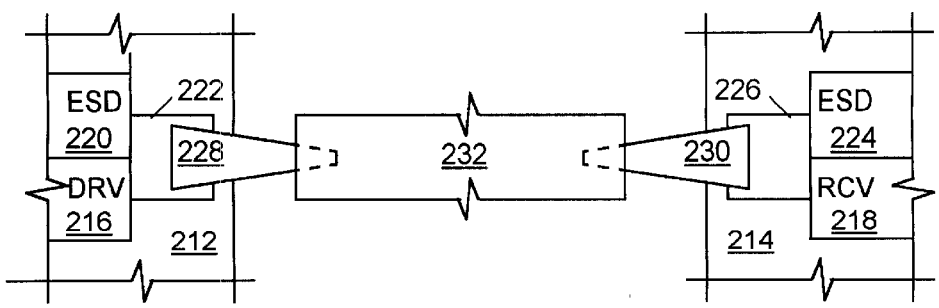
Figure 9:
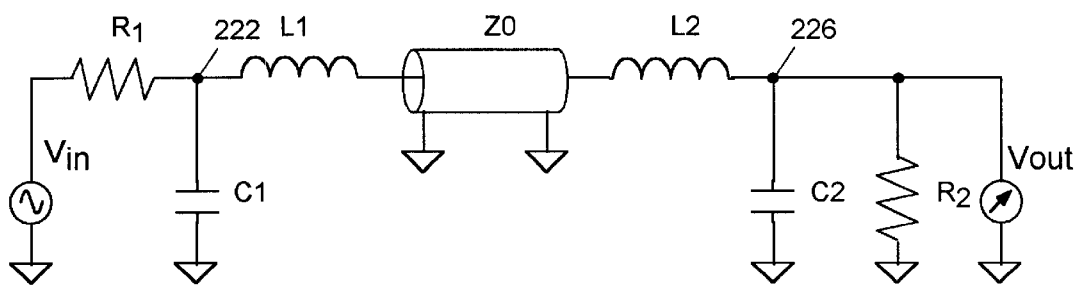
Figure 10:
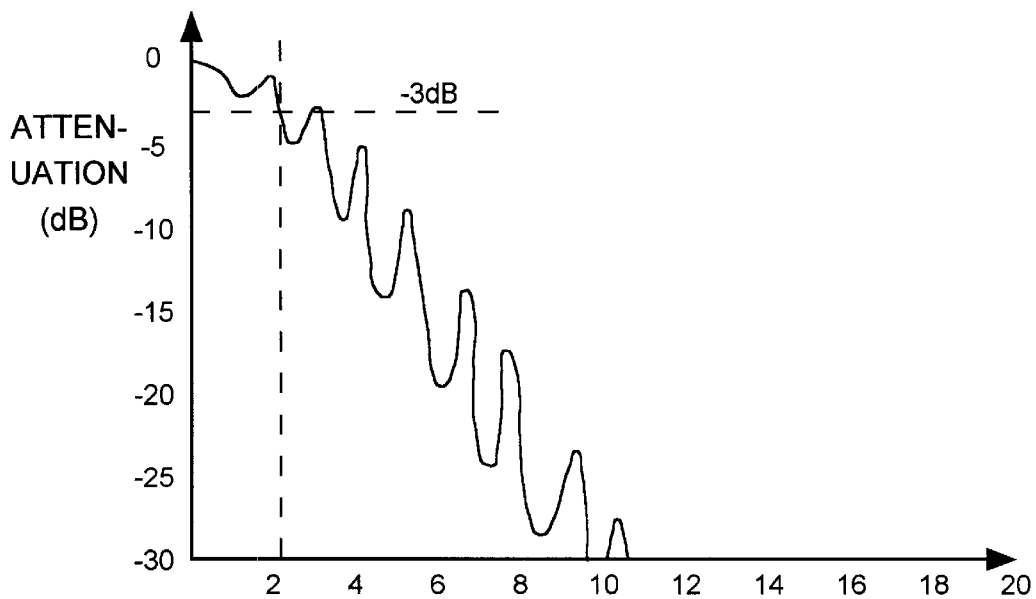
Figure 11:
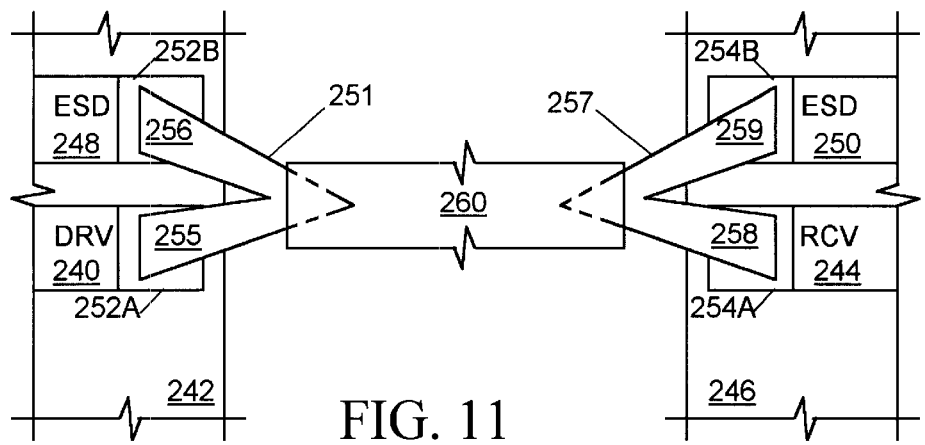
Figure 12:
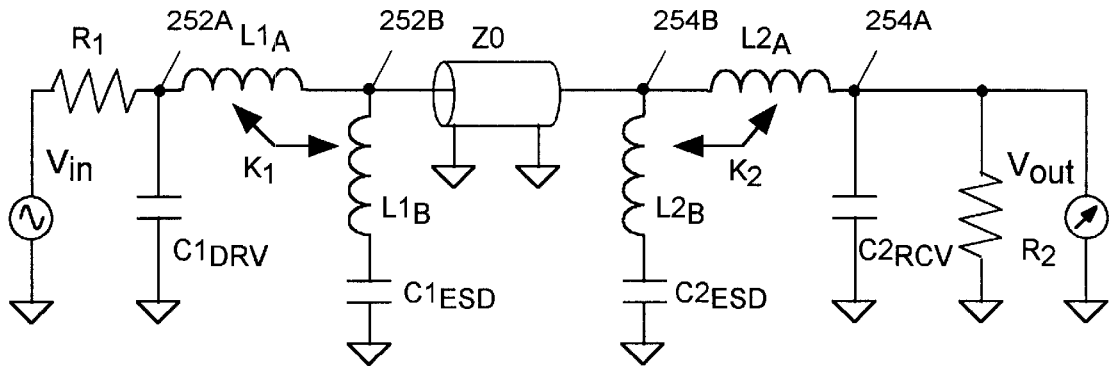
Figure 13:
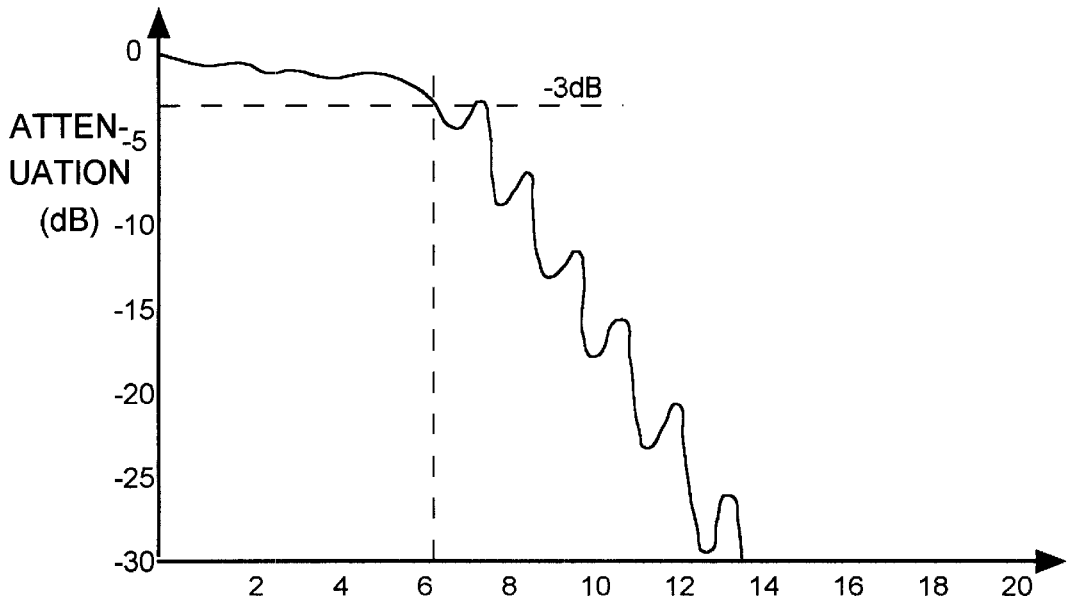
Figure 14:
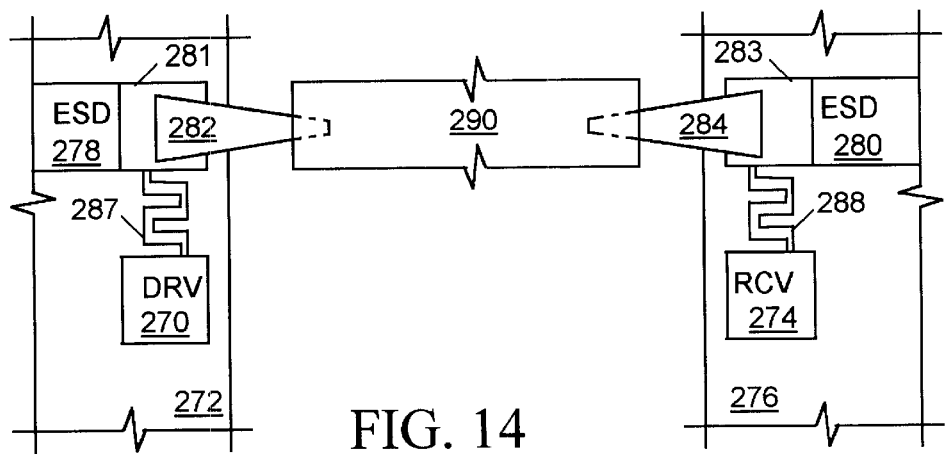
Figure 15:
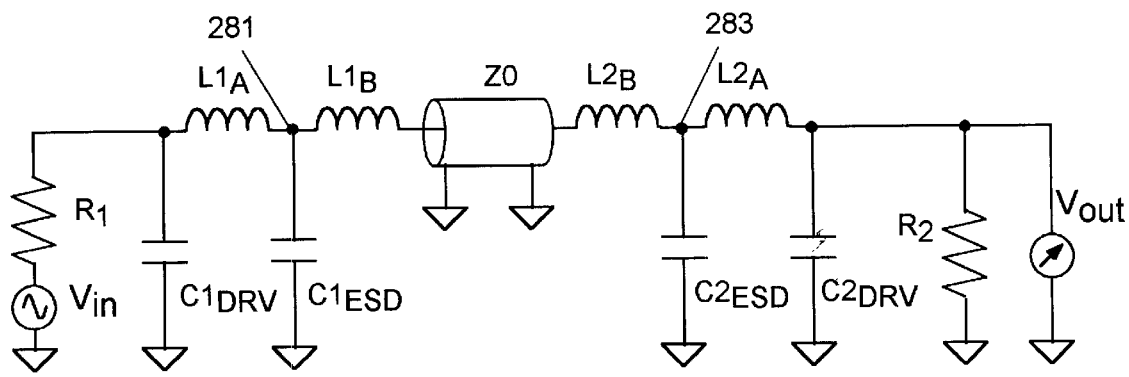
Figure 16:
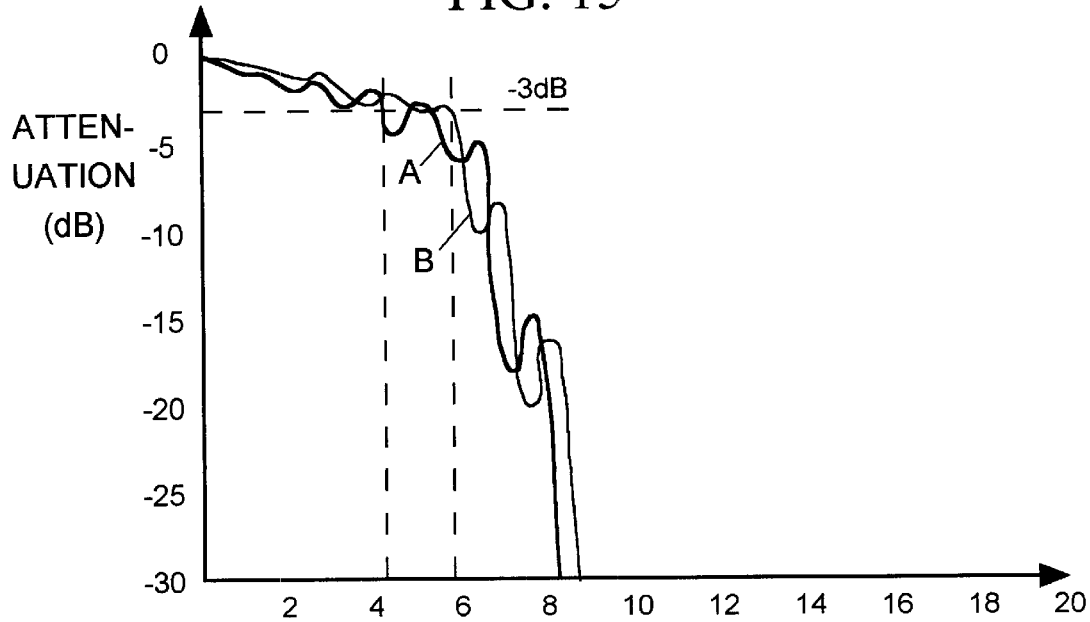
Figure 17:
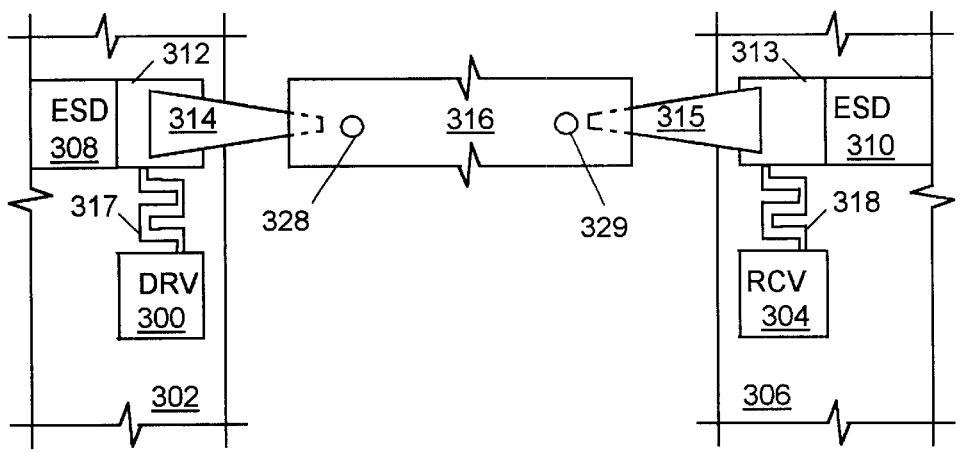
Figure 18:
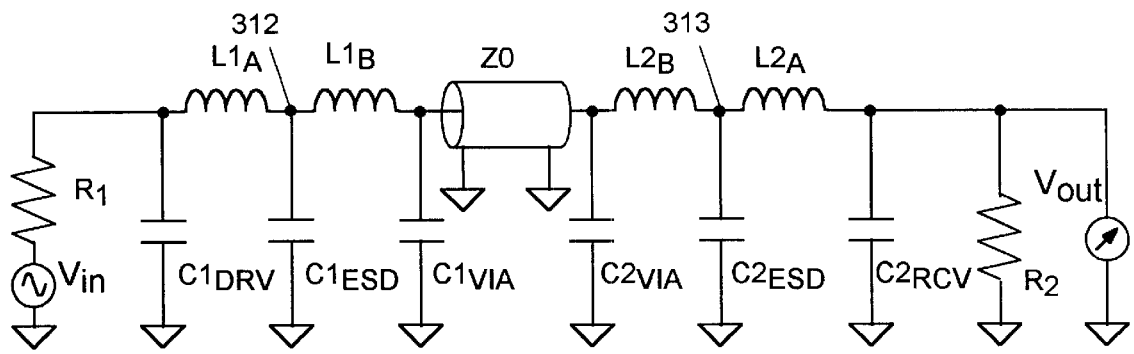
Figure 19:
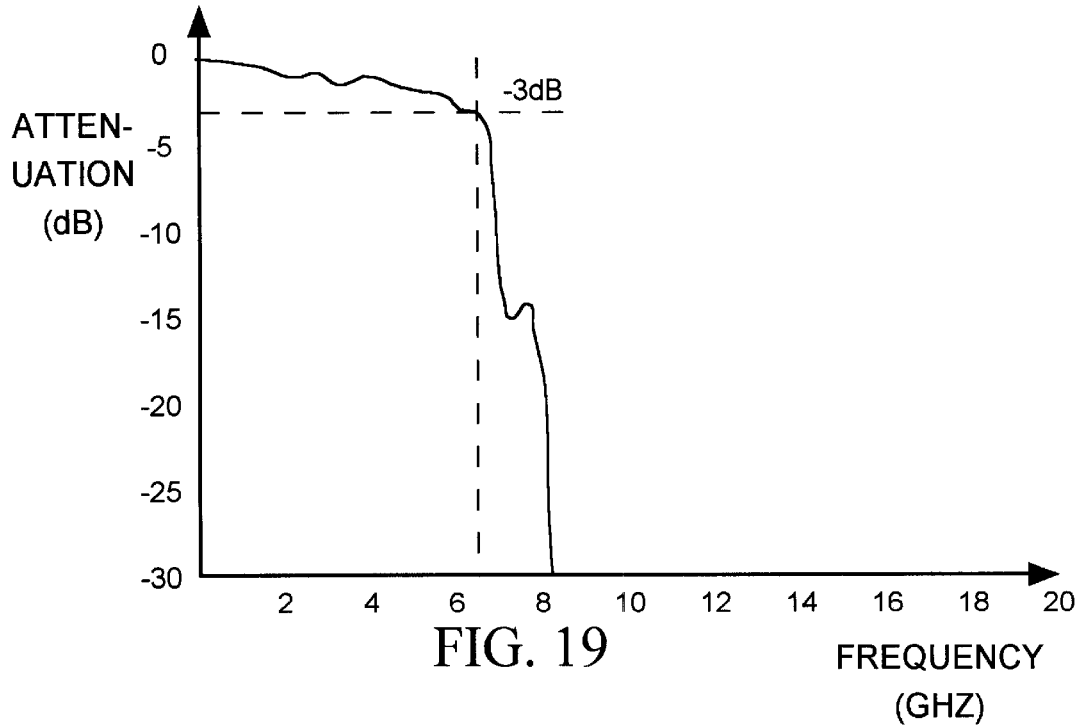
Figure 20:
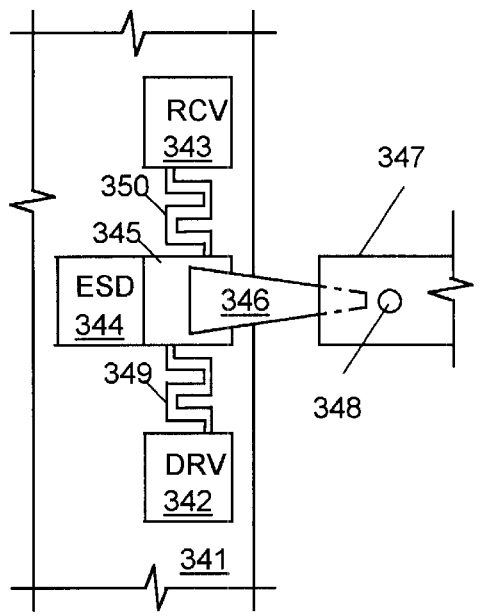
Figure 21:
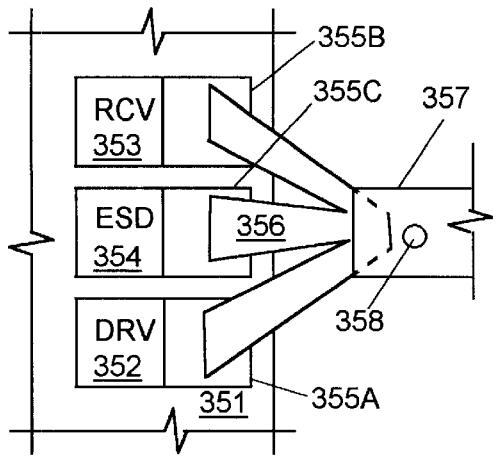
Figure 22:
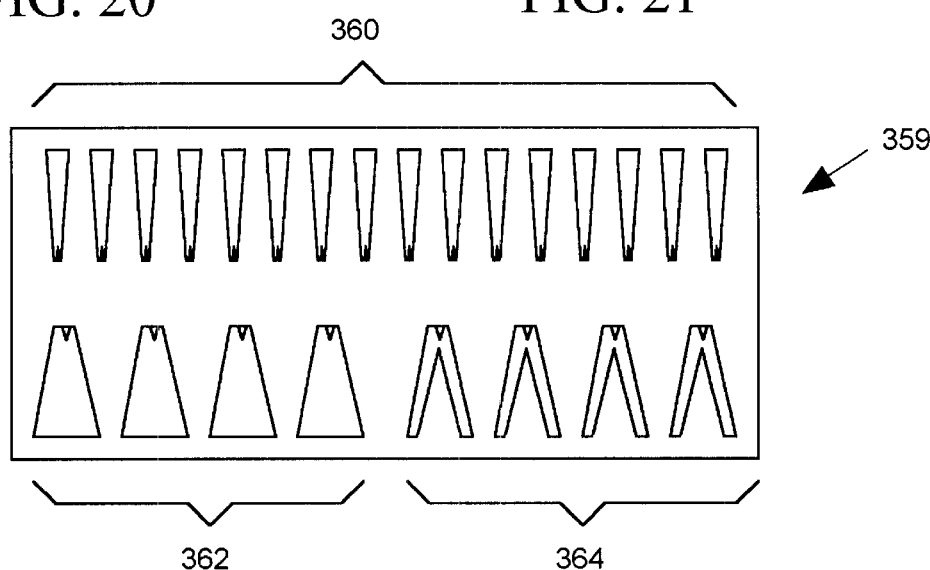
Figure 23:
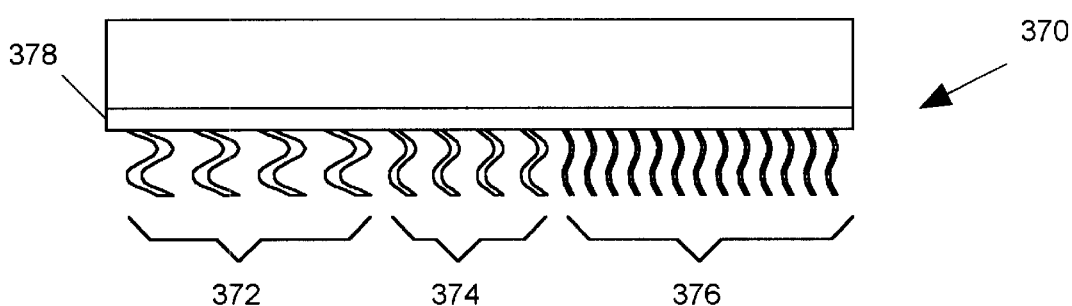

FIG. 1 illustrates a typical prior art process of designing, fabricating, testing and packaging an integrated circuit (IC), FIGS. 2 and 3 are a partial sectional elevation views of ICs employing wire-spring contacts, FIG. 4 is a partial sectional elevation view of an IC employing litho-spring contacts, FIG. 5 is a simplified side elevation view of a prior art wafer-level IC tester employing probes to contact an IC, FIG. 6 illustrates a process flow of designing, fabricating, testing and mounting an IC employing a cell library including interconnect component cells in accordance with the invention, FIG. 7 is a simplified plan view of a prior art wafer-level test system suitable for testing a wafer having micro-spring or litho-spring contacts, FIG. 8 is a plan view of two ICs and a prior art structure for interconnecting them, FIG. 9 is an equivalent circuit diagram modeling the electrical behavior of input/output devices of the ICs of FIG. 8 and the prior art structure interconnecting them, FIG. 10 illustrates the frequency response of the equivalent circuit of FIG. 9, FIG. 11 is a plan view of two ICs and an interconnect system for interconnecting them in accordance with the present invention, FIG. 12 is an equivalent circuit diagram modeling the electrical behavior of input/output devices of the ICs of FIG. 11 and the interconnect system interconnecting them, FIG. 13 illustrates the frequency response characteristics of the equivalent circuit of FIG. 12, FIG. 14 is a plan view of two ICs and an interconnect system for interconnecting them in accordance with a first alternative embodiment of the present invention, FIG. 15 is an equivalent circuit diagram modeling the electrical behavior of input/output devices of the ICs of FIG. 14 and the interconnect system interconnecting them, FIG. 16 illustrates the frequency response characteristics of the equivalent circuit of FIG. 15, FIG. 17 is a plan view of two ICs and an interconnect system for interconnecting them in accordance with the present invention, FIG. 18 is an equivalent circuit diagram modeling the electrical behavior of input/output devices of the ICs of FIG. 17 and the interconnect system interconnecting them, FIG. 19 illustrates the frequency response characteristics of the equivalent circuit of FIG. 18, FIGS. 20 and 21 are simplified partial plan views of interconnect systems for interconnecting multiple devices implemented in an integrated circuit to a printed circuit board trace, FIG. 22 is a simplified plan view of an IC employing a variety of litho-spring contacts, and FIG. 23 is a simplified side elevation view of an IC employing a variety of wire-spring contacts.

DESCRIPTION OF THE PREFERRED EMBODIMENT(S)

IC Design Using Component Cell Libraries

An integrated circuit (IC) design engineer initially generates a high-level behavioral model of a circuit using a hardware description language (HDL). For a digital IC employing synchronous logic, this model typically describes how the circuit logically processes data flowing between clocked registers. The HDL circuit model is purely logical and does not take into account timing or other limitations of the IC technology that is to implement the IC. However conventional computer-based design (CAD) synthesis tools enable the design engineer to convert the HDL model of the circuit into a lower-level behavioral model (e.g. a "netlist") depicting the circuit as a set of interconnected circuit components or "cells" that may be implemented using a particular IC technology. While the netlist model describes each cell in terms of its behavior rather than its structure, the behavioral model of each cell is based on the known performance of a circuit component that can be implemented in a particular IC technology, and that model covers both the logic and timing aspects of component performance. The design engineer's IC specification defines various circuit performance criteria and constraints. The synthesis tools typically develop the netlist model in an iterative fashion, simulating each iteration of the model to determine how well it satisfies its specified criteria and constraints. After using simulators and other tools to verify that the circuit described by the netlist model will behave as expected, floorplanning, placement and routing tools convert the netlist behavioral model of the IC into a structural model of the IC defining a set of lithographic masks used during IC fabrication. The placement and routing tools determine the position on the IC of the various components of the IC and determine how to route signal paths interconnecting those components.

During the design process, the various CAD tools typically acquire information about the circuit components that can be incorporated into an IC from a "cell library", also called a "technology library". Component cells included in a cell library may describe low-level circuit components such as resistors and transistors, gate-level components such as NAND and NOR gates, registers and flip-flops, and high-level components ("macro cells" or "modules") such as adders, multiplexers, arithmetic logic units and input/output (I/O) drivers and receivers. Cell libraries may also include component cells describing very complex components that may be embedded into an IC such as random access memories and microprocessors. Each component cell includes an electrical behavioral model of a related circuit component that simulators and verification tools use when analyzing the circuit design. Each component cell library also includes a structural model of the circuit component describing masks for controlling the formation of the various layers of the IC needed to implement the circuit component.

Interconnect Component Cells

The present invention relates to interconnect systems for conveying I/O signals between an IC and external circuits, and in particular to a method for merging the design of IC interconnect systems into the process of designing of the ICs themselves. Various types of interconnect systems can link an IC to the external world. For example, in a typical packaged IC, a separate bond wire connects each I/O terminal that communicates with an external circuit through I/O signals to a bond pad on the surface of the IC through a driver or a receiver for buffering an outgoing or incoming I/O signal. An IC will usually also include an internal electrostatic discharge (ESD) protection device linked to each bond pad for protecting the IC from static electricity. Bond wires link the IC's bond pads to package pins. When installed in its intended operating environment, an IC's package pins are typically soldered to a printed circuit board (PCB) trace which extends the signal paths to pins of other ICs or devices mounted on the PCB or to connectors on the PCB that extend the signal paths to circuits or other devices residing elsewhere.

The drivers, receivers, ESD devices, bond pads and other components forming the portions of an interconnect system that is internal to an IC typically appear as individual component cells in a cell library. The bond wires, package pins, PCB traces and other components of an interconnect system linking an IC node to a node of an external circuit do not appear in conventional cell libraries because they are not part of the IC. However, since the portions of an interconnect system that are external to an IC will have an influence on the behavior of the IC, design engineers often incorporate a behavioral specification or model of the external portions of an IC's interconnect systems into the HDL and netlist models. The model usually depicts the external portions of an interconnect system as a simple transmission line of a standard characteristic impedance, such as 50 Ohms, that is terminated with its characteristic impedance and a specified load. During the IC design process, simulation and verification tools can make reasonably accurate predictions of circuit behavior based on such models when designers endeavor to conform the external portions of interconnect systems to their behavioral models.

IC designers typically specify uniform interconnect systems for all IC terminals partly because IC manufacturing processes readily lend themselves to interconnect uniformity and partly because it is difficult and time-consuming to custom design an interconnect system for each IC terminal. However not all signals entering and leaving an IC are alike, and by restricting all of an ICs interconnect systems to a uniform design, designers give up the ability to better match the characteristics of each interconnect system to the requirements of the signal it carries, for example in terms of optimizing the interconnect system's frequency response or load carrying capacity.

In accordance with the invention, a conventional cell library is expanded to include a set of "interconnect" component cells in addition to its conventional IC component cells. Each interconnect component cell describes a separate component that may form a part of an interconnect system linking a circuit node to an external circuit. Each such interconnect system component described by an interconnect component cell may reside inside or outside the IC. For example, internal interconnect system components may include drivers, receivers, ESD protection devices, bond pad, spiral inductors and the like. External interconnect system components may include, for example, bond wires, package legs, spring contacts, solder ball connectors, PCB traces and vias, discrete inductors and capacitors, coaxial, ribbon or other types of cables. Each such interconnect component cell includes both a behavioral model and a structural model of the component.

With both IC component and interconnect component cells available in the cell libraries, the CAD tools that design, simulate and verify the internal portions of an IC can concurrently develop, simulate and verify a complete interconnect system for each of the IC's I/O terminals, including portions of each interconnect that are external to the IC. This enables the CAD tools to treat the IC and its interconnect systems as a unified design, giving them the flexibility to select and arrange system components not only internal to the IC but also external to the IC. This allows the CAD tools to improve the performance of an IC by separately designing each of its interconnect systems to optimize its frequency response relative to the nature of the signal it is to convey.

Spring Contacts

To allow the CAD tools designing an IC the ability to custom design portions of the interconnect system that are external to each IC terminal so as to optimize its performance, it is helpful to provide the tools as wide a degree of freedom as possible when selecting each component of an interconnect systems. An unpackaged IC including wire-spring or litho-spring contacts formed directly on the IC's bond pads can be directly mounted on a PCB with its contacts contacting traces on the PCB. Since it is relatively easy to separately adjust the impedance and current-carrying capacity of each of an IC's wire-spring or litho-spring contact, wire-spring and litho-spring contact interconnect systems are preferable to bond wire/package leg interconnect systems with respect to customizing the interconnect system for each of an IC's I/O terminals.

Thus a cell library including interconnect component cells in accordance with the present invention is particularly suited for designing ICs employing wire-spring and litho-spring contacts due to the ease and precision with which their impedance and current-carrying characteristics can be individually adjusted. Also, as discussed below, since the spring contacts that interconnect the IC to external circuits in its intended operating environment can also be used to interconnect the IC to test equipment in a wafer-level test environment, the behavior models of the interconnect system upon which the CAD tools base their simulation can closely match interconnect performance not only in the IC's intended operation environment but also in the IC's testing environment.

Improved IC Process Flow

FIG. 6 illustrates a process flow of designing, fabricating, testing and interconnecting an IC in accordance with the invention wherein the CAD tools that design the IC also design its interconnect systems. In the example of FIG. 6 it is assumed that the IC employs wire-spring or litho-spring contacts, though a somewhat similar process flow could be employed with other types of interconnect systems such as, for example, bond wire and solder ball interconnect systems.

Referring to FIG. 6, a design engineer initially produces a design specification (step 50) abstractly describing the behavior of the IC and specifying relevant performance criteria and constraints of the ICs internal circuits as well as performance criteria and constraints for each of the IC's I/O, power and ground interconnect systems. Interconnect system criteria and constraints may include, for example, signal levels and loads, and desired frequency response characteristics.

The design engineer then (step 52) uses CAD tools to develop a high-level HDL behavioral model of the IC and its interconnected systems, and employs a circuit simulator (step 54) to simulate circuit behavior based on the HDL circuit model. The design engineer may iteratively adjust and simulate the HDL model until the simulation verifies that the circuit logic behaves as specified. Thereafter, the design engineer employs CAD synthesis tools (step 56) to convert the high-level HDL circuit model into a lower-level, technology specific behavioral model of the circuit, such as a netlist. The netlist describes circuit components using behavioral models of component cells included in a cell library 60.

In accordance with the invention, cell library 60 also includes a set of interconnect component cells, each describing a separate component of an interconnect system for conveying an I/O, power or ground signal between a node of an IC and an external circuit, including interconnect system components that are external to the IC.

Each interconnect component cell relating to a component that is internal to the IC (drivers, receivers, bond pads, ESD protection devices, and the like) also provides a physical model of the masks needed to lay out and interconnect that circuit component. Each interconnect component cell relating to a component that is external to the IC (such as bond wires, package pins, spring contacts, PCB traces, etc.) also includes a physical specification of that component. For example a cell for a bond wire may specify the length and thickness of the bond wire. An interconnect cell describing a litho-spring would includes all of the masks need to produce the litho-spring contact. Each interconnect component cell also includes a behavioral model for the component based on its physical characteristics. For example the behavior model for a bond wire is suitably an inductor having an inductance determined on the basis of the bond wires length and diameter. A PCB trace might be modeled by an RLC (resistance/inductance/capacitor) network with RLC values determined by the physical characteristics of the PCB trace.

During the synthesis process (step 56) CAD tools not only iteratively design and simulate the IC logic, they also iteratively design the entire interconnect system component cell for each I/O, power or ground terminal of the IC and include effects of the interconnect system in the simulations. Since it is not always necessary or desirable to provide the same interconnect system for each terminal, the CAD tools can custom design an interconnect system for each terminal that best meets the specified constraints and criteria for that particular terminal.

During the synthesis process, simulator and other tools (step 62) verify that the circuit and interconnect systems described by the netlist model will meet logic and timing specifications. The synthesis tools may iteratively simulate and alter the IC and its interconnect systems to optimize their performance. Having verified the logic and timing of the netlist circuit and interconnect model, the netlist is supplied as input to CAD tools carrying out detailed IC floorplanning and interconnect system design (step 64). During the floorplanning process, placement and routing tools 68 fix locations of component cells within the IC, including its bond pads and other internal portions of its interconnect systems. In accordance with the invention, the external portions of each interconnect system is also designed in detail at this stage of the process. In the example of FIG. 6, wherein the IC is to be connected to a PCB through spring contacts, the system designs each spring contact and each trace to which the spring contact is to be connected. The processes of developing an IC floorplan, IC placement and routing planes, and interconnect system designs are iterative, with simulation and verification tools 72 being employed to test each iteration of the design to determine how well the IC and its interconnect systems meet constraints and criteria the design engineer set forth in the specification.

One output of floorplanning process 64 is a description of a set of masks defining the various layers of the IC. These masks tell an IC manufacturer how to fabricate multiple copies of the IC as die on a semiconductor wafer (step 74). The floorplanning process also provides a design for each wire-spring or litho-spring contact to be formed on the IC (step 83), a design or specification for portions of a PCB to be produced (step 89) for linking the IC to other circuits in its intended operating environment, as well as a design for an interconnect system for accessing the IC during testing (step 85).

Wire-spring or litho-spring contacts may be installed on the wafer immediately after the wafer fabrication step 74. However, as illustrated in FIG. 6, when an IC includes a "repairable" memory having one or more spare rows or columns of memory cells that can replace a row or column containing one or more defective cells, the contacts are installed on the wafer after the memory has been tested and repaired. Thus as illustrated in FIG. 6, after a repairable memory has been tested (step 78) in accordance with a memory test specification provided by the design engineer, the results of the memory test are subjected to "redundancy analysis" (step 80) to determine how to allocate spare rows and/or columns to replace the rows and/or columns containing defective cells. The memory is then repaired (step 82) using lasers or other means to appropriately alter signal path routing within the IC so that spare rows and/or columns of cells are substituted for rows and columns having defective cells. Since it is necessary for lasers to access various points on an IC in order to repair a laser-repairable memory, wire-spring or litho-spring contacts are not added to the IC (step 83) until after the memory has been tested and repaired. However when an IC does not include a repairable memory, steps 78–82 are not needed and the spring contacts are added to the IC immediately following wafer fabrication step 74.

After adding the spring contacts to the wafer (step 83) in accordance with the contact specification output of step 68, the ICs on the wafer may be subjected to a burn-in process (step 84) wherein they are heated in an oven to place the ICs under the kind of heat stress they may encounter in their working environments. At the same time, any memories included in the ICs may be subjected to a "long cycle" test to determine whether each memory cell can retain data for a sufficient period of time. After the burn-in process, the logic of each IC on the wafer is tested (step 85). The testing interconnect design produced at step 64 defines the interconnect system that links the IC to the IC tester. After being tested at step 85, the wafer is diced to separate the IC die from the wafer (step 86), and each IC that passes all tests is mounted on a PCB (step 88) fabricated at step 89 in accordance with the PCB interconnect design produced at step 64.

Wafer-level Tester Interconnects

Suppose, for example, an IC designer specifies an interconnect system having, for example, a 3 GHz bandwidth but the interconnect system linking the IC to a wafer-level tester has a somewhat narrower bandwidth. In such case ICs that might otherwise function properly when linked to external circuits through the specified higher frequency interconnect system will fail tests due to the inadequacy of the tester's interconnect system rather than to defects in the ICs themselves. If we cannot connect an IC tester to an IC though an adequate interconnect system, then we cannot properly test it. If we cannot properly test an IC, then the IC may be of marginal commercial utility. It is helpful for an IC's interconnect systems for both its intended PCB operating environment and its testing environment be designed concurrently with the IC (step 64) because in doing so, constraints on both the PCB and tester interconnect systems act as constraints on the design of the IC itself. The design of an IC and of its PCB and testing interconnect systems become mutually interdependent.

FIG. 7 is a simplified plan view of a wafer-level test system 108 suitable for testing a wafer 110 having spring contacts 112. Wafer 110 is mounted in a cassette 114 having a printed circuit board ("contactor board") 116 including conductive pads on its lower surface arranged to contact the tips of spring contacts 112. A test head 118 may be linked to contactor board 116, for example, through pogo pins or coaxial cables 120. Traces and vias in contactor board 116 link pins or cables 120 to the pads accessing spring contacts 112. Contactor board 116 is designed in accordance with the external interconnect specification output of step 68 (FIG. 6) so that it provides signal paths having impedance characteristics similar to the paths provided by the PCB fabricated at step 89 (FIG. 6). This makes the interconnect systems linking I/O terminals of an IC under test very similar to the interconnect systems that will link the IC to external circuit nodes in the IC's intended operating environment. It is also helpful to mount the tester's drivers and receivers directly on contactor board 116 instead of in test head 118 and to design those drivers and receivers so that they have the I/O impedances and loads defined by the external interconnect specification. This renders the IC's interconnect characteristics in the testing and operating environments similar to one another and to the interconnect system characteristics assumed during the design phase simulation and verification.

Interconnect System Design

The interconnect system for each of an IC's terminals, derived from interconnect component cells in accordance with the invention, can be optimized for the particular type of signal it is to convey. For example interconnect systems that convey power and ground signals might best have high currently-carrying capacity and a very narrow bandwidth so that they could strongly attenuate low and high frequency noise signals. An interconnect system for an audio frequency signal might preferably have a very flat response in the audio frequency range. High frequency signals require interconnect systems having very wide bandwidths.

As an I/O signal's frequency increases, the combination of series inductances and shunt capacitances in an interconnect system increasingly attenuate and distort the signal. The conventional approach to providing high bandwidth interconnects has been to minimize the series inductance and shunt capacitance of the interconnect system and to impedance match the various transmission lines forming an interconnect system. The inductance of bond wires and package legs or spring contacts can be minimized by keeping them as small as possible. Driver, receiver and ESD device capacitances can be reduced to some extent by suitably adjusting shapes and dimensions of the structures within the IC that form them. The PCB trace impedance can be controlled by appropriately choosing physical characteristics of the trace such as its width and length, its spacing from ground planes, and the nature of the insulating material forming the circuit board. Since vias, conductors passing vertically through a circuit board to interconnect PCB traces on various layers of the PCB, can be a source of capacitance along the PCB trace, designers typically avoid the use of vias in high frequency applications to limit the shunt capacitance of the interconnect system. When vias are unavoidable, designers usually try to structure them so as minimize their capacitance.

Although minimizing the inductances and capacitances of the various structures forming an interconnect system can help increase the bandwidth, flatten frequency response and reduce the signal distortion, it is not possible to completely eliminate interconnect system inductance and capacitance. Thus some level of signal distortion and attenuation is inevitable when signal frequencies are sufficiently high. But the performance of an interconnect system can be further improved by carefully arranging and sizing the inductance and capacitance of each of its components so that the interconnect system acts like a filter that has been tuned for a desired frequency response.

FIG. 8 is a simplified plan view of a prior art interconnect system including a pair of ICs 212 and 214. IC 212 includes a driver 216 generating a high frequency IC output signal while IC 214 includes a receiver 218 for receiving that output signal. Driver 216 and an ESD device 220 are linked to a pad 222 on IC 212 while receiver 218 and an ESD device 224 are linked to a pad 226 on the surface of IC 214. One litho-spring contact 228 links pad 222 to a PCB trace 232 and another litho-spring contact 230 links pad 226 to trace 232. Thus driver 216 transmits a signal to receiver 218 via a signal path formed by pad 222, litho-contact 228, trace 232, litho-contact 230 and pad 226.

FIG. 9 is an equivalent circuit diagram modeling devices within ICs 212 and 214 of FIG. 8 and the various structures interconnecting them. Driver 216 is modeled as an ideal signal source $V_{in}$ transmitting its output signal through a resistance R1. The capacitance to ground at bond pad 222 is modeled as a single capacitor C1 including the sum of the output capacitance of driver 216 and the capacitance of ESD device 220. Spring contact 228 is primarily inductive at higher signal frequencies and therefore can be modeled as a single inductor L1. Receiver 218 is modeled as an ideal signal receiver $V_{OUT}$ having input impedance R2. The capacitance at bond pad 226 is modeled as a single capacitor C2 including the sum of capacitances of ESD device 224 and receiver 218. The inductance of spring contact 230 is modeled by a single inductor L2. Trace 232 is modeled by its characteristic impedance Z0. Assuming no major source of capacitance outside of ICs 212 and 214 is connected to PCB trace 232, and assuming trace 232 is designed for low capacitance, the PCB trace capacitance is substantially 0.

The interconnect system linking driver $V_{in}$ and receiver $V_{out}$ can substantially attenuate and distort high frequency signals passing between driver 216 and receiver 218. The conventional approach to reducing the amount of signal distortion and attenuation in high frequency applications has been to minimize the series inductance and shunt capacitances in the path between $V_{in}$ and $V_{out}$. Following this approach, designers of prior art interconnect systems would avoid the use of vias on trace 232 and would carefully design trace 232 to substantially eliminate its capacitance. Inductances L1 and L2 would be minimized by keeping spring contacts 228 and 230 as small as possible. The capacitances C1 and C2 at bond pads 222 and 226 would be minimized by carefully choosing various structural characteristics of the components of ICs 212 and 214 linked to pads 222 and 226.

Table I below illustrates typical impedance values for L1, L2, C1 and C2 for the prior art interconnect system equivalent circuit of FIG. 9. The 50 Ohm impedance values for R1, R2 and Z0 are typical in high frequency applications. The 1 nH and 2 pF capacitance values are typical of minimum practically obtainable values.

TABLE I

| ELEMENT | IMPEDANCE |
| --- | --- |
| L1 | 1 nH |
| L2 | 1 nH |
| C1 | 2 pF |
| C2 | 2 pF |
| Z0 | 50 Ohms |
| $R_1$ | 50 Ohms |
| $R_2$ | 50 Ohms |

FIG. 10 illustrates the frequency response characteristics of the interconnect system of FIG. 8 when components impedances are set to the values indicated in Table I. If we define the upper limit of the passband as the minimum frequency at which attenuation is −3 dB, then FIG. 9 shows that the prior art interconnect system of FIG. 8 has a 2 GHz bandwidth. Note that since the passband is not particularly flat between 0 and 2 GHz, the interconnect system will distort signals because it will attenuate some signal frequencies in the passband substantially more than others.

The optimal frequency response for an interconnect system depends on the system's application. For example, when the interconnect system is to convey an analog signal with little distortion or noise, designers want the passband to be only as wide as needed to pass the highest expected frequency component of the signal, they want the passband to be as flat as possible to avoid signal distortion, and they want the stopband to drop off quickly to block high frequency noise. When the interconnect system conveys high frequency digital signals, designers want the passband to be very wide, and they may not be as concerned about its flatness. FIG. 10 shows that the passband of the interconnect system of FIG. 8 is not wide enough to accommodate signals above 2 GHz so the interconnect system would not be suitable for conveying higher frequency signals. Also the passband ripple above about 0.5 GHz may make the interconnect system unsuitable for signal frequencies above 0.5 GHz when only low levels of distortion can be tolerated. Finally, since the frequency response illustrated in FIG. 10 fails to fall off rapidly in the stop band, the prior interconnect system of FIG. 8 may be unsuitable in any application in which it is important to severely attenuate high frequency noise.

FIG. 11 illustrates an improved interconnect system as may be defined by an integrated interconnect component cell of a cell library in accordance with the present invention. The interconnect system connects a driver 240 within an IC 242 to a receiver 244 within an IC 246. ICs 242 and 246 also include conventional ESD devices 248 and 250 for protecting the ICs from voltage spikes. Here separate bond pads 252A, 252B, 254A and 254B are provided for driver 240, ESD device 248, receiver 244 and ESD device 250, respectively. A Y-shaped litho-spring contact 251 having legs 255 and 256 attached to bond pads 252A and 252B links those bond pads to a PCB trace 260. A similar Y-shaped lithospring contact 257 having legs 258 and 259 links bond pads 254A and 254B to PCB trace 260.

FIG. 12 is an equivalent circuit diagram of the interconnect system of FIG. 11. Driver 240 of FIG. 11 is represented in FIG. 12 as an ideal source $V_{in}$ connected to pad 252A through resistance R1. Receiver 244 of FIG. 11 is represented in FIG. 12 as an ideal receiver $V_{out}$ having input resistance R2 connected to pad 254A. Contact legs 255, 256, 258 and 259 are modeled as inductances $L1_A$, $L1_B$, $L2_A$, and $L2_B$, respectively. The parameters $K_1$ and $K_2$ are the mutual inductance factors for inductors $L1_A$ and $L1_B$ and for inductors $L2_A$ and $L2_B$. The values of $K_1$ and $K_2$ may be adjusted by changing the acute angle and distance between contact legs 255 and 256 or 258 and 259. The capacitances of driver 240, ESD device 248, receiver 244 and ESD device 250 are represented in FIG. 12 as capacitors $C1_{DRV}$, $C1_{ESD}$, $C2_{RCV}$ and $C2_{ESD}$, respectively. Trace 260 is represented in FIG. 12 by its characteristic impedance Z0.

In the prior art equivalent circuit of FIG. 9, the driver and ESD device capacitances $C1_{DRV}$ and $C1_{ESD}$ appear in parallel and are represented by a single capacitor C1. In FIG. 12, due to the separation of bond pads 252A and 252B, and the use of separate contact legs to connect them to trace 260, the driver and ESD device capacitances $C1_{DRV}$ and $C1_{ESD}$ are isolated from one another though inductances $L1_A$ and $L1_B$ of contact legs 255 and 256. Similarly, the receiver and ESD device capacitances $C2_{RCV}$ and $C2_{ESD}$ are isolated from one another though contact leg inductances $L2_A$ and $L2_B$.

By isolating ESD device capacitances $C1_{ESD}$ and $C2_{ESD}$ from the main signal path we improve interconnect system frequency response. Table II below compares impedance values of the prior art interconnect system of FIG. 9 (Table I) with impedance values of the improved interconnect system of FIG. 12 when selected in accordance with the present invention.

TABLE II

| PRIOR ART | | IMPROVED | |
|---|---|---|---|
| L1 | 1nH | $L1_A$ | 2.6 nH |
| | | $L1_B$ | 0.6 nH |
| L2 | 1nH | $L2_A$ | 2.6 nH |
| | | $L2_B$ | 0.6 nH |
| C1 | 2pF | $C1_{DRV}$ | 0.7 pF |
| | | $C1_{ESD}$ | 1.3 pF |
| C2 | 2pF | $C2_{RCV}$ | 0.7 pF |
| | | $C2_{ESD}$ | 1.3 pF |
| Z0 | 50 Ohms | Z0 | 50 Ohms |
| R1 | 50 Ohms | R1 | 50 Ohms |
| R2 | 50 Ohms | R2 | 50 Ohms |
| | | $K_1$, $K_2$ | 0.9 |

Note that in the improved interconnect system of FIG. 11 the sum of capacitances of $C1_{DRV}$ and $C1_{ESD}$ and the sum of capacitances $C2_{RCV}$ and $C2_{ESD}$ are each 2.0 pf, the value of capacitances C1 and C2 of the interconnect system of FIG. 8. Thus the capacitances of the drivers, receivers and ESD devices are the same for both interconnect systems. Values of R1, R2 and Z0 are also the same for both interconnect systems. Note, however, that because the interconnect system of FIG. 11 uses larger spring contacts than the circuit of FIG. 9, the total interconnect system inductance $L1_A+L1_B+L2_A+L2_B$ (6.4 nH) of the improved interconnect system of FIG. 11 is much larger then the total inductance L1+L2 (2 nH) of the prior art interconnect system of FIG. 8. Since conventional wisdom holds that frequency response is improved by reducing interconnect system inductance, not by increasing it, we might expect that with all other interconnect system component values being the same, the interconnect system of FIG. 8 would have a better frequency response than the "improved" interconnect system of FIG. 11. However such is not the case.

FIG. 13 illustrates the frequency response of the interconnect system of FIG. 12. FIG. 13 shows that the bandwidth of the interconnect system of FIG. 11 is approximately 6 GHz, substantially larger than the 2 GHz bandwidth of the prior art system as illustrated in FIG. 10. This improvement in bandwidth arises because inductances $L1_B$ and $L2_B$ isolate the ESD device capacitances $C1_{ESD}$ and $C2_{ESD}$ from the main signal path. Thus when wide bandwidth is desired, it is generally beneficial to increase $L1_B$ and $L2_B$ to the extent possible without affecting the ability of ESD devices 248 and 250 to provide adequate protection from electrostatic noise spikes. Note too that the passband (0–6 GHz) as seen in FIG. 13 is relatively flatter (has less ripple) than the passband (0–2 GHz) illustrated in FIG. 10. This means that the improved interconnect system of FIG. 11 will pass signals with much less distortion than the interconnect system of FIG. 8.

FIG. 14 illustrates an interconnect system for interconnecting a driver 270 within an IC 272 to a receiver 274 within an IC 276. ICs 272 and 276 also include conventional ESD devices 278 and 280. A bond pad 281 and a litho-spring contact 282 link ESD device 278 to a PCB trace 290, while a bond pad 283 and litho-spring contact 284 link ESD device 280 to trace 290. A spiral inductor 287 formed on a metalization layer of IC 272 links driver 270 to bond pad 281 while a spiral inductor 288 formed on IC 276 links receiver 274 to bond pad 283.

FIG. 15 is an equivalent circuit diagram of the interconnect system of FIG. 14. Driver 270 of FIG. 14 is represented in FIG. 15 as an ideal source $V_{in}$ connected to pad 281 through the driver's output resistance R1. Receiver 274 of FIG. 14 is represented in FIG. 15 as an ideal receiver $V_{out}$ having input resistance R2 connected to pad 283. Spiral inductor 287 and 288 and spring contacts 282 and 284 are modeled in FIG. 15 as inductances $L1_A$, $L2_A$, $L1_B$, and $L2_B$, respectively. Since spring contact 282 and spiral inductor 287 are substantially perpendicular, their mutual inductance is negligibly small. The same is true for spring contact 284 and spiral inductor 288. Trace 290 is represented in FIG. 15 by its characteristic impedance Z0.

Table III below lists suitable impedance values of the interconnect system of FIG. 15.

TABLE III

| | |
|---|---|
| $L1_A$ | 1.4 nH |
| $L1_B$ | 1.4 nH |
| $L2_A$ | 1.4 nH |
| $L2_B$ | 1.4 nH |
| $C1_{DRV}$ | 0.7 pF |
| $C1_{ESD}$ | 1.3 pF |
| $C2_{RCV}$ | 0.7 pF |
| $C2_{ESD}$ | 1.3 pF |
| Z0 | 50 Ohms |
| R1 | 50 Ohms |
| R2 | 50 Ohms |

Note that all component values are similar to those used when determining the frequency response (FIG. 13) of the interconnect system of FIG. 11 (see Table II, "Improved" column) except for differences in inductances $L1_A$, $L1_B$, $L2_A$ and $L2_B$ and the lack in mutual inductance in the interconnect system of FIG. 14.

FIG. 16 illustrates the frequency response (plot A) of the interconnect system of FIG. 15 wherein the values of various components are set in accordance with Table III. Plot A of FIG. 16 shows that the bandwidth of the interconnect system of FIG. 14 is approximately 4 GHz, smaller than the 6 Ghz bandwidth of the interconnect system of FIG. 10, but still substantially larger than the 2 GHz bandwidth of the prior art system as illustrated in FIG. 10. The bandwidth of the interconnect system of FIG. 14 is not as wide as that of the interconnect system of FIG. 11 primarily because inductors $L1_B$ and $L_{2B}$ are series inductances whereas in the system of FIG. 14 they are shunt inductances. Note that even though the total series inductance in the improved system of FIG. 14 (5.02 nH) is substantially larger than the total series inductance (2 nH) in the interconnect system of FIG. 8, the system of FIG. 14 has approximately twice the bandwidth.

While the bandwidth (4 GHz) of the interconnect system of FIG. 14 is smaller than the 6 GHz bandwidth of the system of FIG. 11, the interconnect system of FIG. 14 may be preferable in applications where the wider bandwidth is not needed because the frequency response of the system of FIG. 14 has sharper roll off and has no major spikes in the stopband above 4 GHz. This means that the system of FIG. 14 will do a better job of blocking high frequency noise than the system of FIG. 11.

The frequency response of the circuits of FIGS. 11 and 14 can be further improved by appropriately adjusting series inductances, for example, by adjusting the lengths and width of the litho-spring contacts or by adjusting the angle between contact spring legs to alter their mutual inductance. Table IV below compares impedance values for the interconnect circuit of FIG. 14 used when computing frequency response plot A of FIG. 16 (Table III) to impedance values for the circuit of FIG. 14 used when computing another frequency response plot.(Plot B) of FIG. 16.

TABLE IV

| | PLOT A | PLOT B |
|---|---|---|
| $L1_A$ | 1.4 nH | 1.50 nH |
| $L1_B$ | 1.4 nH | 0.65 nH |
| $L2_A$ | 1.4 nH | 1.50 nH |
| $L2_B$ | 1.4 nH | 0.65 nH |
| $C1_{DRV}$ | 0.7 pF | 0.7 pF |
| $C1_{ESD}$ | 1.3 pF | 1.3 pF |
| $C2_{RCV}$ | 0.7 pF | 0.7 pF |
| $C2_{ESD}$ | 1.3 pF | 1.3 pF |
| Z0 | 50 Ohms | 50 Ohms |
| R1 | 50 Ohms | 50 Ohms |
| R2 | 50 Ohms | 50 Ohms |

Note that except for differences in bond wire inductances, the component values used to compute frequency response B are similar to the value used when determining frequency response A. Note that frequency response B has a bandwidth of about 6 GHz instead of 4 GHz.

While the conventional approach to reducing the amount of signal distortion and attenuation caused by the interconnect system has been to minimize the inductance and capacitance of the interconnect system, since it is not possible to completely eliminate interconnect system inductance, an unacceptable level of signal distortion and attenuation is inevitable when signal frequencies are sufficiently high. However as discussed above, further improvements in interconnect system frequency response can be had by actually increasing and appropriately arranging system inductance and capacitance. While lower values of interconnect system inductance and capacitance generally improve system frequency response, particular values of system inductance and capacitance that are higher than the minimum attainable values can substantially improve various characteristics of system frequency response.

FIG. 17 illustrates an interconnect system for linking a driver 300 within an IC 302 to a receiver 304 within an IC 306. ICs 302 and 306 also include conventional ESD devices 308 and 310. Bond pads 312 and 313 and litho-spring contacts 314 and 315 link ESD devices 308 and 310 to a PCB trace 316. Spiral inductors 317 and 318 link driver 300 and receiver 304 to pads 312 and 313, respectively. The interconnect system of FIG. 17 is structurally similar to the interconnect system of FIG. 14 except that in the system of FIG. 17 a pair of vias 328 and 329 of appropriately sized capacitance are added to trace 316. Via 328 is connected to trace 316 near the point of contact between litho-spring contact 314 while via 329 is connected to trace 316 near the point of contact between litho-spring contact 315 and trace 316.

A "via" is a conductive path passing vertically through a PCB and is normally employed to link a trace such as trace 316 to a trace on some other layer of the PCB. While vias conveniently distribute signals to various layers of a PCB, vias are typically avoided in high frequency applications because their capacitance can degrade the frequency response of the interconnect system. However vias 328 and 329 are added precisely because the additional capacitance they provide at trace 316, when appropriately adjusted, improves system frequency response. The additional PCB capacitance provided by vias 328 and 329 could also be obtained by connecting discrete capacitors or other capacitive elements to trace 316. However most PCB manufacturers can easily add vias to a PCB and can easily adjust their capacitance by adjusting via dimensions. Thus vias 328 and 329 are a convenient way to obtain the necessary additional PCB capacitance needed to improve system frequency response and have the added benefit of allowing more flexibility in signal routing. As a side benefit, vias 328 and 329 could be used to route signals to other PCB layers, but they need not be used for that purpose.

FIG. 18 is an equivalent circuit diagram of the interconnect system of FIG. 17. Driver 300 of FIG. 17 is represented in FIG. 18 as an ideal source $V_{in}$ connected to pad 312 through the driver's output resistance R1 and the inductance $L1_A$ of spiral inductor 317. Receiver 304 of FIG. 19 is represented in FIG. 18 as an ideal receiver $V_{out}$ having input resistance R2 connected to pad 313 through the inductance $L2_A$ of spiral inductor 318. Inductors $L1_B$ and $L2_B$ represent the inductances of contacts 314 and 315, respectively. The capacitances of driver 300, ESD device 308, receiver 304 and ESD device 310 are represented in FIG. 18 as capacitors $C1_{DRV}$, $C1_{ESD}$, $C2_{RCV}$ and $C2_{ESD}$, respectively. The capacitance of vias 328 and 329 is represented by capacitors $C1_{VIA}$ and $C2_{VIA}$, respectively. Trace 316 is represented by its characteristic impedance Z0.

Table V below lists suitable component values for the interconnect system of FIG. 18. FIG. 19 illustrates the frequency response of the interconnect system of FIG. 15 using the Table V values of various components.

TABLE V

| | |
|---|---|
| $L1_A$ | 1.4 nH |
| $L1_B$ | 1.4 nH |
| $L2_A$ | 1.4 nH |
| $L2_B$ | 1.4 nH |
| $C1_{DRV}$ | 0.7 pF |
| $C1_{ESD}$ | 1.3 pF |
| $C1_{VIA}$ | 0.7 pF |
| $C2_{RCV}$ | 0.7 pF |
| $C2_{ESD}$ | 1.3 pF |
| $C2_{VIA}$ | 0.7 pF |
| Z0 | 50 Ohms |
| R1 | 50 Ohms |
| R2 | 50 Ohms |

Comparing these values to the values listed in Table IV we note that all component values are similar to those used when determining the frequency response (plot A, FIG. 18) of the interconnect system of FIG. 14 except for the added via capacitance $C1_{VIA}$ and $C2_{VIA}$. Comparing plot A of FIG. 16 to FIG. 19 we see that the added via capacitance increases the bandwidth of the interconnect system from 4 GHz to approximately 6 GHz, substantially larger than the 4 GHz bandwidth (plot A, FIG. 18) of the interconnect system of FIG. 14. Note also that the passband in FIG. 19 (0–6 GHz) is flatter (has less ripple) than the passband of plots A or B of FIG. 16, and that the stopband drops off more quickly. Thus despite the conventional wisdom that adding capacitance to an interconnect system will degrade its frequency response, a comparison of FIG. 16 and FIG. 19 shows us that increasing the capacitance of the PCB trace as illustrated in FIG. 17 can actually allow an interconnect system to pass higher frequency signals and with less distortion, provided that the additional PCB capacitance is appropriately sized.

Butterworth and Chebyshev Filters

The "optimal" frequency response of an interconnect system is application-dependent. For example in some applications we may want to maximize bandwidth. In other applications we may be willing, for example, to accept a narrower bandwidth in exchange for a flatter passband, less attenuation at lower frequencies, or steeper roll off in the stopband. Since the frequency response of the interconnect system depends on the impedance of its component values, the appropriate values to which the inductances $L1_A$, $L1_B$, $L2_A$ and $L2_B$ and any added PCB via capacitance $C1_{VIA}$ and $C2_{VIA}$ of the interconnect system of FIG. 18 should adjusted are application dependent.

We can view the equivalent circuits of the interconnect system illustrated in FIGS. 11, 15 and 18 as 4-pole or 5-pole filters. By appropriately adjusting bond wire inductance and/or via capacitance, the interconnect system can be made to behave like a well-known, multi-pole "Butterworth" filter which provides a maximally flat frequency response or like a well-known multi-pole Chebyshev filter which can optimize a combination of bandwidth and roll-off characteristics. The design of multi-pole Butterworth and Chebyshev filters, including appropriate choices for component values so as to optimize various characteristics of a filter's frequency response, is well-known to those skilled in the art.

Multiple Drivers and Receivers

In many ICs more than one signal driver and/or receiver may access a single IC input/output pin or package leg. In such cases, in accordance with the invention, the various drivers, receivers and ESD devices are provided with separate bond pads interconnected by bond wires or other conductors having appropriately sized inductance.

FIG. 20 illustrates a portion of an interconnect system for an IC 341 including a driver 342, a receiver 343, an ESD device 344, a bond pad 345 and a litho-spring contact 346 coupling bond pad 345 to a PCB trace 347. A via 348 is connected to trace 347. ESD device 344 is directly linked to bond pad 345 while driver 342 and receiver 343 are linked to bond pad 345 through spiral inductors 349 and 350, respectively. FIG. 21 illustrates a portion of an interconnect system for an IC 351 including a driver 352, a receiver 353, an ESD device 354 each directly linked a separate one of bond pads 355A–355C. A three-legged litho-spring contact 356 couples bond pads 355A–355C to a PCB trace 357. A via 358 is linked to trace 357. As for the interconnect systems discussed above, the frequency responses of the interconnect systems of FIGS. 20 and 21 can be optimized for various applications by appropriately sizing the inductances and capacitances of the various components of the interconnect.

FIG. 22 is a simplified plan view of an example IC 359 employing various litho-spring contacts forming portions of interconnect systems specified by interconnect component cells selected to optimize various criteria. A set of small contacts 360 are included in interconnect systems as illustrated in FIG. 8 that are to carry low-current, low frequency digital signals. Another set of large contacts 362 are included in interconnect systems that are to carry large current power and ground signals. A third set of two-legged contacts 364 are included in interconnect systems as illustrated in FIG. 11 that are to carry low-current, high frequency digital signals.

Since litho-spring contacts can be accurately shaped by lithographic processes, and since their shapes determined their inductances, their inductances can be controlled with high resolution. Thus desired characteristics of the frequency response of the interconnect system, such as passband width or flatness, can be accurately controlled when litho-spring technology is employed for IC interconnects. However, the principles of interconnect system design discussed above can also be applied to spring contact, bond wire and other types of contact systems. For example interconnect systems generally similar to those illustrated in FIGS. 8, 14, 17, and 20 can be implemented using wire-spring contacts in place of the litho-spring contacts. The impedances and current capacities of wire-spring contacts can be controlled by adjusting contact dimensions and shapes and (referring to FIG. 3) by appropriately shaping the conductive redistribution layer 22 that links the spring contact 16 to bond pad 14.

FIG. 23 is a simplified side elevation view of an example IC 370 employing various wire-spring contacts forming portions of interconnect systems specified by interconnect component cells selected to optimize various criteria. A set of large diameter wire-spring contacts 372 are included in interconnect systems that are to carry large current power and ground signals. Medium-sized wire-springs 374 are intended to conduct I/O with controlled impedance. Small diameter wire-springs 376 as suitable for acting as high impedance IC I/O terminals. As mentioned above, the series inductance of each individual wire-spring contact 372–376 can be adjusted to optimize the interconnect system frequency response to suit the requirements of the particular signal it is to carry by adjusting the shape of the signal path within the redistribution layer 378 linking that wire-spring contact to an IC I/O pad.

Interconnect systems generally similar to those depicted in FIGS. 8, 11, 17, 20 and 21 can be formed using bond wires in place of the litho-springs. The function of the two- or three-legged litho-spring contacts illustrated in FIGS. 11 and 21 can be carried out by two or three bond wires. The inductances and current carrying capacities of bond wires can be controlled by adjusting dimensions of the bond wires. However litho-spring and wire-spring contacts generally provide more latitude in adjusting inductance than bond wires.

Thus has been shown and described an improved process flow for designing, fabricating, and testing an integrated circuit wherein the design of test and operating environment interconnect systems is integrated into the IC design process. A conventional cell library is expanded to include interconnect component cells describing interconnect system components not only internal to, but also external to, the IC. This gives the design process the ability to optimize IC performance not by optimizing just the internal IC design but by concurrently optimizing both internal and external portions of the interconnect systems thorough which it must communicate. Moreover, by merging the design of the IC with the design of its interconnect systems (including both its operating and test environment interconnect systems), we improve overall IC performance. We also increase IC fabrication yields by decreasing the likelihood of IC test failures due to inadequate tester interconnect systems.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

We claim:

1. A method for designing, fabricating, testing and interconnecting an integrated circuit (IC) to external circuit nodes, the method comprising the steps of:

a. providing a cell library including a plurality of component cells and a plurality of interconnect component cells, wherein each component cell corresponds to a separate IC component, and includes a structural model and a behavior model of its corresponding IC component, the structural model describing a layout of the corresponding IC component within the IC, wherein each interconnect component cell corresponds to a separate component of an interconnect system forming a signal path between at least one internal circuit node of the IC and at least one external circuit node, wherein each interconnect component cell includes structural and behavioral models of its corresponding interconnect system component, wherein at least one of said interconnect component cells corresponds to a interconnect system component that is external to said IC, wherein the structural model of each interconnect component residing within the IC describes its layout within the IC; and b. selecting IC components to be included in said IC and selecting components of a plurality of interconnect systems to provide signal paths between said IC and an external circuit node by selecting corresponding ones of said plurality of component cells and interconnect component cells.

2. The method in accordance with claim 1 further comprising the steps of:

c. creating a behavioral model of said IC communicating via at least one of said plurality of interconnect systems selected based on behavioral models included in one of said interconnect component cells selected at step b, and d. employing said behavioral model created at step c to simulate a behavior of said IC when communicating with one of said external nodes via said at least one interconnect system.

3. The method in accordance with claim 2 further comprising the steps of:

e. generating an IC structural model based on IC component structural models and interconnect system structural models included in the component cells and interconnect component cells selected at step b, and f. fabricating said IC on a semiconductor wafer in accordance with said IC structural model.

4. The method in accordance with claim 3 further comprising the steps of:

g. linking said IC fabricated on said semiconductor wafer at step f to an integrated circuit tester through conductive paths; and h. employing said integrated circuit tester to test behavior of said IC.

5. The method in accordance with claim 4 further comprising the steps of:

i. fabricating portions of the interconnect systems selected at step b that are external to said IC in accordance with specifications included in interconnect component cells selected at step b; and j. linking said IC to external circuit nodes via the interconnect system portions fabricated at step i.

6. The method in accordance with claim 3 wherein at least one interconnect component cell selected at step b corresponds to a spring contact and includes a description of the spring contact, wherein the method further comprises the step of:

g. fabricating the spring contact on said IC in accordance with the description of the spring contact included in its corresponding interconnect component cell.

7. The method in accordance with claim 6 further comprising the steps of:
   h. linking said IC fabricated on said semiconductor wafer to an integrated circuit tester via said spring contact fabricated at step g; and
   i. employing said integrated circuit tester to test behavior of said IC using a signal conveyed via said spring contact fabricated at step g.

8. The method in accordance with claim 7 further comprising the step of:
   j. linking said IC to an external circuit node via said spring contact fabricated at step g.

9. The method in accordance with claim 2
   wherein the components of at least one interconnect system selected at step b comprise:
      a driver internal to said IC for generating a first signal to be conveyed by the interconnect system in response to a second signal produced at an internal node of the IC,
      a receiver external to said IC for receiving said first signal, and
      conductive means internal and external to said IC for conveying said first signal from said driver to said receiver,
   wherein the behavioral model of said IC communicating via said at least one interconnect system models a manner in which impedances of said driver, said conductive means, and said receiver affect said first signal.

10. The method in accordance with claim 9
    wherein said at least one interconnect system further comprises an electrostatic discharge protection device, and
    wherein the behavioral model of said IC communicating via said at least one interconnect system also models a manner in which an impedance of said electrostatic protection device affects said first signal.

11. The method in accordance with claim 1 wherein at least two of said plurality of said interconnect systems selected at step b have substantially differing maximum current-carrying capacities.

12. The method in accordance with claim 1 wherein at least two of said plurality of interconnect systems selected at step b include spring contacts having substantially differing maximum current-carrying capacities.

13. The method in accordance with claim 1 wherein at least two of said plurality of interconnect systems selected at step b include bond wires having substantially differing maximum current-carrying capacities.

14. The method in accordance with claim 1 wherein at least two of said plurality of interconnect systems selected at step b comprise spring contacts of substantially differing dimensions.

15. The method in accordance with claim 1 wherein at least two of said plurality of said interconnect systems selected at step b have substantially differing frequency response characteristics.

16. The method in accordance with claim 15 wherein at least two of said plurality of said interconnect systems selected at step b have substantially differing frequency response characteristics.

17. A method for designing an integrated circuit (IC) having a plurality of terminals for transmitting signals to and receiving signals from external circuits and for designing a plurality of interconnect systems, each providing a complete signal path between one of said terminals and a circuit node external to said IC, the method comprising the steps of:
   a. generating a hardware description language (HDL) description of the IC and said plurality of interconnect systems and descriptions of performance criteria and constraints for the IC and for the plurality of interconnect systems;
   b. providing a cell library including IC component cells and interconnect component cells, wherein each IC component cell provides both a physical and behavioral model of a component that may be incorporated into the IC, wherein each interconnect component cell includes both a physical and behavioral model of a separate component of said interconnect systems, including components both internal and external to the IC;
   c. employing synthesis tools to process said HDL description thereby producing a netlist design of said IC and said plurality of interconnect systems by selecting IC and interconnect component cells included in the cell library and by specifying a manner in which corresponding IC and interconnect system components are to be connected to one another.

18. The method in accordance with claim 17 further comprising the steps of:
   d. simulating behavior of the IC and its interconnect systems based on the netlist design produced at step c and on behavioral models provided by IC and interconnect component cells included in said cell library to estimate how well an IC and its interconnect systems produced in accordance with the netlist design will satisfy said performance criteria and constraints.

19. The method in accordance with claim 18 further comprising the step of
   e. generating a floorplan, a placement plan and a routing plan for said IC based on said netlist design and on the physical models provided by IC and interconnect component cells included in said cell library.

20. The method in accordance with claim 19 further comprising the step of
   f. generating a physical design of portions of said interconnect systems that are external to said IC based on said netlist design and on the physical models provided by IC and interconnect component cells included in said cell library.

21. The method in accordance with claim 20 further comprising the step of
   g. simulating behavior of the IC and its interconnect systems based on the floorplan, placement plan and routing plan generated at step e and on the physical design of portions of said interconnect systems that are external to said IC generated at step f and on behavioral models provided by IC and interconnect component cells included in said cell library to estimate how well an IC and its interconnect systems produced in accordance with said floorplan, placement plan, and routing plan and said physical design will satisfy said performance criteria and constraints.

22. The method in accordance with claim 21 further comprising the step of
   h. fabricating said IC in accordance with the floorplan, placement plan and routing plan generated at step e.

23. The method in accordance with claim 22 further comprising the step of
   i. fabricating said portions of said interconnect systems that are external to said IC in accordance with the physical design generated at step f.

24. The method in accordance with claim 22 wherein each said interconnect system includes a spring contact and other portions external to said IC, and wherein the method further comprises the step of:
  i. fabricating said spring contacts on a surface of said IC in accordance with the physical design generated at step f.

25. The method in accordance with claim 24 further comprising the step of
  j. fabricating other portions of at least two of said interconnect systems in accordance with the physical design generated at step f.

26. The method in accordance with claim 25 wherein said other portions of said interconnect systems include printed circuit board traces.

27. The method in accordance with claim 22 wherein said physical design generated at step f describes portions of first interconnect systems external to said IC that are to link said IC to an integrated circuit tester and portions of second interconnect systems that are to link said IC to said external circuits.

28. The method in accordance with claim 17 further comprising the steps of:
  i. fabricating said portions of said first interconnect systems in accordance with the physical design generated at step f, and
  j. linking said IC fabricated at step h to an integrated circuit tester via said portions of said first interconnect systems fabricated at step i.

29. The method in accordance with claim 28 further comprising the steps of
  k. fabricating said portions of said second interconnect systems in accordance with the physical design generated at step f, and
  l. linking said IC fabricated at step h to said external circuits via said portions of said first interconnect systems fabricated at step i.

* * * * *